(12) United States Patent
Matsumoto et al.

(10) Patent No.: US 10,750,138 B2
(45) Date of Patent: Aug. 18, 2020

(54) PROJECTION DEVICE

(71) Applicant: FUNAI ELECTRIC CO., LTD., Osaka (JP)

(72) Inventors: Mitsuyoshi Matsumoto, Kobe (JP); Shinya Shimizu, Higashiosaka (JP); Takao Mizuno, Amagasaki (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 668 days.

(21) Appl. No.: 15/283,444

(22) Filed: Oct. 3, 2016

(65) Prior Publication Data

US 2017/0099469 A1  Apr. 6, 2017

(30) Foreign Application Priority Data

Oct. 5, 2015  (JP) ................. 2015-197625
Oct. 5, 2015  (JP) ................. 2015-197629
Sep. 26, 2016  (JP) ................. 2016-187061

(51) Int. Cl.
*H04N 9/31* (2006.01)
*G02B 27/01* (2006.01)
*H01S 5/062* (2006.01)
*H01S 5/40* (2006.01)
(Continued)

(52) U.S. Cl.
CPC ....... *H04N 9/3155* (2013.01); *G02B 27/0101* (2013.01); *H01S 5/06216* (2013.01); *H01S 5/4093* (2013.01); *H04N 9/3129* (2013.01); *H04N 9/3161* (2013.01); *H04N 9/3164* (2013.01); *H04N 9/3194* (2013.01); *G02B 2027/0118* (2013.01); *H01S 5/005* (2013.01); *H01S 5/0014* (2013.01); *H01S 5/0617* (2013.01)

(58) Field of Classification Search
CPC .. H04N 9/3129; H04N 9/3161; H04N 9/3164; H04N 9/3155; G02B 2027/0118; G02B 27/0101; H01S 5/06216; H01S 5/4093; H01S 5/0014; H01S 5/005; H01S 5/0617
USPC ......................................................... 353/99
See application file for complete search history.

(56) References Cited

U.S. PATENT DOCUMENTS

2009/0059179 A1* 3/2009 Kobori ............... G03B 21/28
                                                    353/52
2009/0244407 A1  10/2009 Sakakibara
(Continued)

FOREIGN PATENT DOCUMENTS

CN  101911711  12/2010
CN  103368067  10/2013
(Continued)

*Primary Examiner* — Jerry L Brooks
(74) *Attorney, Agent, or Firm* — JCIPRNET

(57) ABSTRACT

A projection device is provided, which is capable of suppressing or preventing problems that result from a light emission delay of a light source. The projection device includes a plurality of light sources respectively emitting a laser light; a scanning part enabling the laser light to scan; and a controller controlling an output of the laser light. In a scanning range including a first scanning range and a second scanning range, the controller controls such that the output has a first light amount in the first scanning range and has a second light amount which is greater than the first light amount in the second scanning range.

10 Claims, 22 Drawing Sheets

(51) Int. Cl.
  *H01S 5/00*     (2006.01)
  *H01S 5/06*     (2006.01)

(56)     References Cited

U.S. PATENT DOCUMENTS

| 2010/0097678 | A1* | 4/2010 | Hajjar ..................... G01J 3/506 |
| | | | 359/198.1 |
| 2010/0283413 | A1 | 11/2010 | Richter et al. |
| 2010/0302513 | A1* | 12/2010 | Takahashi .......... G03B 21/2066 |
| | | | 353/33 |
| 2013/0120718 | A1* | 5/2013 | Chikaoka ............. G02B 26/101 |
| | | | 353/85 |
| 2013/0222774 | A1* | 8/2013 | Chikaoka ............. H04N 9/3135 |
| | | | 353/85 |
| 2013/0258210 | A1 | 10/2013 | Kurihara et al. |

FOREIGN PATENT DOCUMENTS

| JP | 2011039324 | 2/2011 |
| JP | 2012-209380 | 10/2012 |

\* cited by examiner

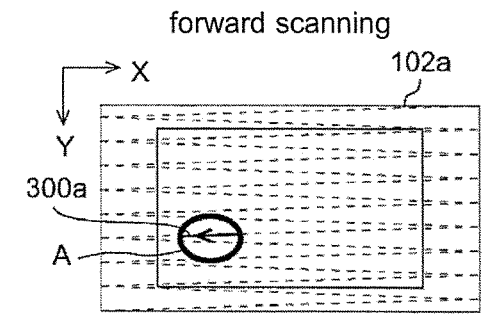
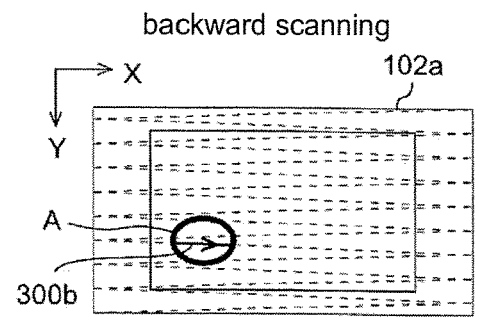
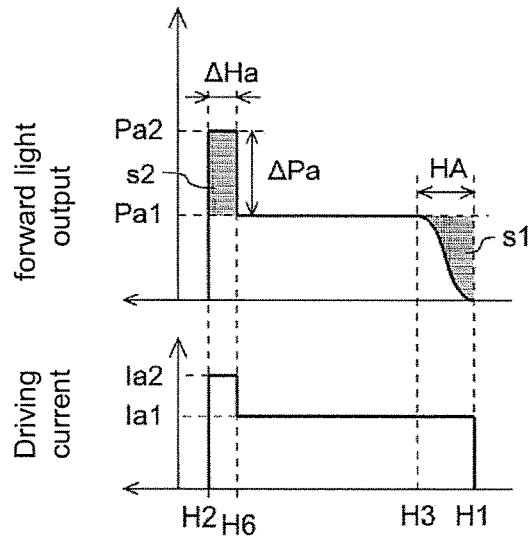
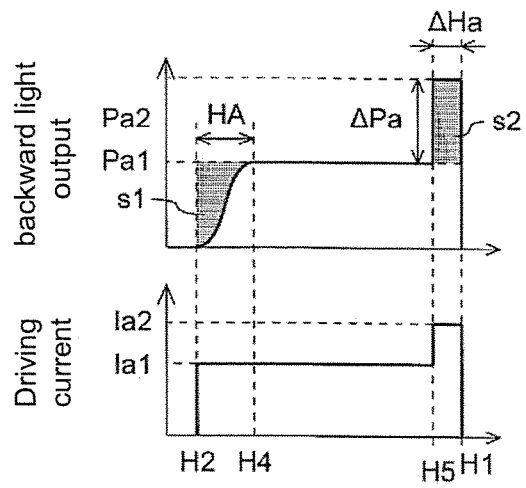
FIG. 21A
FIG. 21B
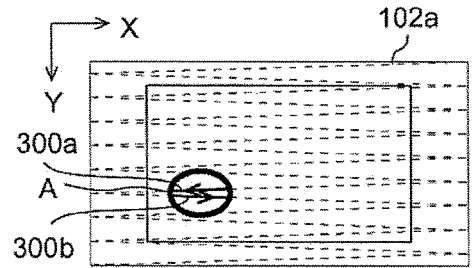
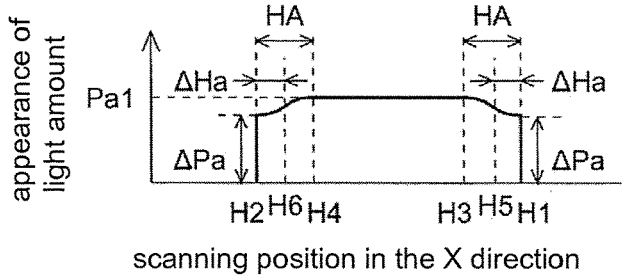
FIG. 21C

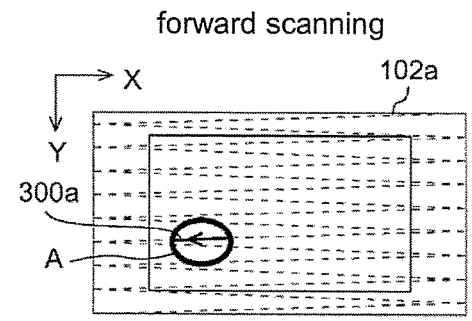
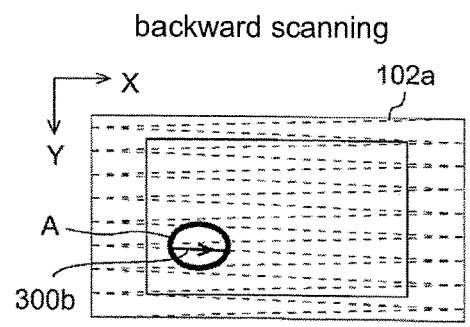
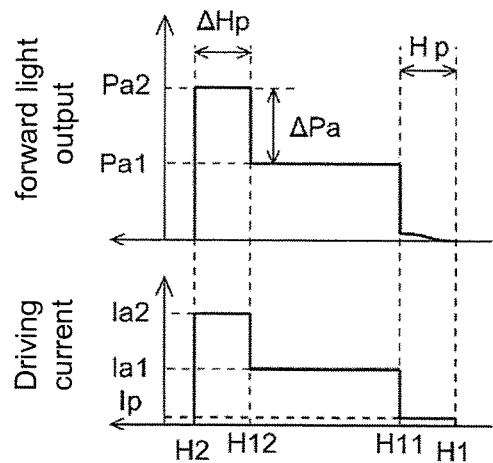
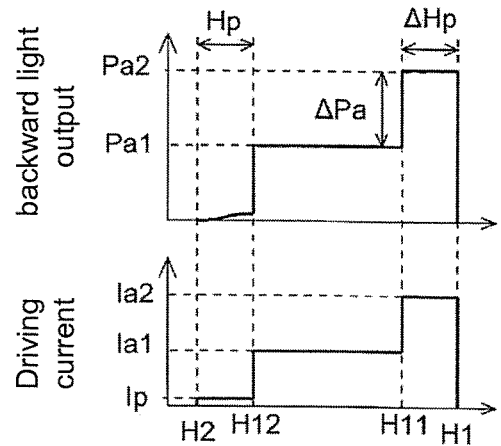
FIG. 26A
FIG. 26B
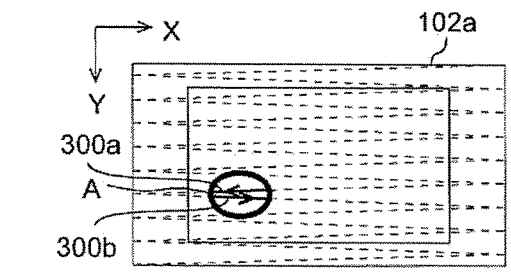
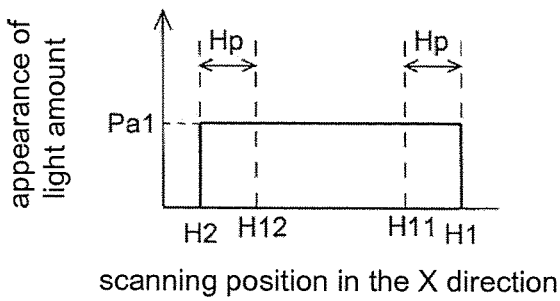
FIG. 26C

PROJECTION DEVICE

CROSS-REFERENCE TO RELATED APPLICATION

This application claims the priority benefit of Japan application serial no. 2015-197625, filed on Oct. 5, 2015, Japan application serial no. 2015-197629, filed on Oct. 5, 2015, and Japan application serial no. 2016-187061, filed on Sep. 26, 2016. The entirety of each of the above-mentioned patent applications is hereby incorporated by reference herein and made a part of this specification.

BACKGROUND OF THE INVENTION

Field of the Invention

The invention relates to a projection device.

Description of Related Art

A projection device that forms an image on a projection surface by light projection utilizes multiple types of semiconductor laser elements, such as red, green, and blue, to project a light of the desired color. However, even with application of a driving current to the semiconductor laser elements, a certain time is required before a carrier having the concentration that enables laser oscillation can be generated. For this reason, a light emission delay may occur and it may take a rise time for the outputted light to reach a light amount corresponding to the driving current. The light emission delay refers to a phenomenon that, at the beginning of application of the driving current, only a low amount of light is outputted from the semiconductor laser elements and it takes time for the outputted light to reach a constant light amount that corresponds to the current value of the applied driving current. Particularly, in recent years, a system that uses a red semiconductor laser element of 600 [nm] and a green semiconductor laser element of 500 [nm] has been put into practical use. These semiconductor laser elements facilitate occurrence of a long rise time in comparison with the conventional semiconductor laser elements of the 1.3 μm band, 1.5 μm band, or 780 nm band. The reason is that these semiconductor laser elements have the characteristics of requiring more time to generate the carrier having concentration that enables laser oscillation.

Thus, in Patent Literature 1 (Japanese Patent Publication No. 2012-209380), for example, an auxiliary current is added to the driving current at the start of light emission to compensate for the light emission delay of the semiconductor laser However, for the light projection device that includes multiple semiconductor laser elements, how much rise time is required may differ depending on the types of the semiconductor laser elements. For this reason, when the semiconductor laser elements have different degrees of light emission delay, the timings at which the semiconductor laser elements output the light having the light amount corresponding to the driving current deviate from one another and color unevenness may occur in the edge portion of the image displayed on the projection surface. For instance, among the multiple types of semiconductor laser elements, the light emission delay tends to occur on red and green semiconductor laser elements. If the semiconductor laser elements emit light at the same time to project a pure white image, since the blue semiconductor laser element does not have any light emission delay, the projected light has color unevenness. In particular, the edge portion of the image turns bluish.

Regarding such issues, Patent Literature 1 has not mentioned making compensation for the different degrees of light emission delay of multiple types of semiconductor laser elements. In addition, the light amount may easily overshoot and it is difficult to adjust the light amount at the start of light emission. Besides, power consumption will increase corresponding to application of the auxiliary current, which is also a problem.

SUMMARY OF THE INVENTION

In view of the above, the invention provides a projection device that is capable of suppressing or preventing problems that result from the light emission delay of the light source.

Accordingly, a projection device according to an embodiment of the invention is provided, and includes a plurality of light sources respectively emitting a laser light, a scanning part enabling the laser light to scan, and a controller controlling an output of the laser light. In a scanning range including a first scanning range and a second scanning range, the controller controls such that the output has a first light amount in the first scanning range and has a second light amount which is greater than the first light amount in the second scanning range (the first configuration).

The projection device of the 1st configuration may include a memory that stores an image information of an image projected to a projection surface, and the controller may control the output of the laser light based on the image information (the second configuration).

Regarding the projection device of the first or the second configuration, in the scanning range, the controller may control such that the output has the first light amount in the first scanning range and has the second light amount which is greater than the first light amount in the second scanning range, based on that a time from when emission of the laser light starts to when the output reaches the first light amount is shorter than a time from when the output starts to decrease from the first light amount toe when the emission of the laser light ends (the third configuration).

Regarding the projection device of any of the first to the third configurations, the scanning part may enable the laser light to scan reciprocally, and an emission start position and an emission end position of the laser light in the first scanning range of a forward scan may be set to respectively correspond to an emission end position and an emission start position of the laser light in the first scanning range of a backward scan (the fourth configuration).

Regarding the projection device of the fourth configuration, the second scanning range of the forward scan may overlap a third scanning range where the laser light of the backward scan is scanned from when backward emission starts to when the output reaches the first light amount (the fifth configuration).

Regarding the projection device of the fifth configuration, a scanning distance in the second scanning range of the forward scan may be equal to or less than a scanning distance in the third scanning range of the backward scan (the sixth configuration).

Regarding the projection device of any of the fourth to sixth configurations, the controller may control such that cumulative light amounts respectively in the second scanning ranges of the forward scan and the backward scan are the same as a cumulative amount of a light amount that is reduced due to an emission delay of the light source (the seventh configuration).

The projection device of any of the first to seventh configurations may further include a light source driving part that supplies a driving current to the light source. The light source is a semiconductor laser element. In a case that a light amount of the laser light is rapidly reduced when emission ends, the light source driving part may reduce the driving current from a first current value, which is equal to or more than an oscillation threshold current, to a second current value, which is less than the oscillation threshold current. The oscillation threshold current indicates a lower limit of a current value by which the semiconductor laser element emits light only in a laser oscillation mode (the eighth configuration).

Regarding the projection device of any of the first to eighth configurations, the controller may increase the second light amount in the second scanning range in a plurality of stages (the ninth configuration).

Regarding the projection device of any of the first to ninth configurations, the light source is a semiconductor laser element. The semiconductor laser element may be applied with a current that is less than a current value, by which the semiconductor laser element emits light only in the laser oscillation mode, in a predetermined period till the emission in the first scanning range starts (the tenth configuration).

Regarding the projection device of the tenth configuration, a supply time of the current may be equal to or more than a time that is required for the semiconductor laser element to reach the light output of the first light amount after starting emission (the eleventh configuration).

Moreover, a projection device according to another embodiment of the invention is provided, and includes a plurality of light sources, having a first light source and a second light source respectively emitting a laser light, and a time for the first light source to output a predetermined light amount is longer than that for the second light source; a scanning part enabling the laser light to scan; and a controller controlling an output of the laser light. The controller may control to supply a driving current to the first light source before the second light source (the twelfth configuration).

Regarding the projection device of the twelfth configuration, the controller may control such that times respectively for a light amount of the first light source and a light amount of the second light source to reach the predetermined light amount are the same (the thirteenth configuration).

Regarding the projection device of the twelfth configuration, the controller may control such that times respectively for a light amount of the first light source and a light amount of the second light source to reach a predetermined percentage of the predetermined light amount are the same, based on a time difference between times from when the emission of the laser light starts to when the predetermined light amount of the plurality of light sources is reached (the fourteenth configuration).

Regarding the projection device of any of the twelfth to fourteenth configurations, the controller may control to supply to the second light source a driving current having a second current value for outputting the predetermined light amount after supplying to the second light source a driving current having a first current value for outputting a light amount less than the predetermined light amount (the fifteenth configuration).

Regarding the projection device of any of the twelfth to fifteenth configurations, the controller may increase the driving current for the second light source in a plurality of stages till a current value for outputting the predetermined light amount (the sixteenth configuration).

The projection device of any of the twelfth to sixteenth configurations may further include a calculating part that calculates the times of the plurality of light sources based on detection results of light detectors that respectively detect the light amounts of the plurality of light sources (the seventeenth configuration).

Regarding the projection device of the seventeenth configuration, the controller may control to enable the laser light to be emitted from the plurality of light sources when scanning an invalid projection region (the eighteenth configuration).

Regarding the projection device of the eighteenth configuration, the calculating part may determine the times based on the detection results of the light detectors when scanning the invalid projection region (the nineteenth configuration).

Regarding the projection device of any of the twelfth to the nineteenth configurations, the predetermined light amount may be a light amount necessary for emitting a white light (the twentieth configuration).

Effects of the Invention

According to the invention, the projection device, capable of suppressing or preventing problems that result from the light emission delay of the light source, is provided. For example, when multiple light emitting elements perform light output, color unevenness of the light caused by the difference in occurrence of the light emission delay between the light emitting elements is improved. In addition, reduction in the light amount resulting from the light emission delay at the start of light emission of the light emitting elements is improved.

BRIEF DESCRIPTION OF THE DRAWINGS

FIG. 21A is a diagram showing a change of the light output of the forward scanning light that scans from the first scanning position to the second scanning position according to the fifth embodiment.

FIG. 21B is a diagram showing a change of the light output of the backward scanning light that scans from the second scanning position to the first scanning position according to the fifth embodiment.

FIG. 21C is a diagram showing a change of the appearance of the light amount of the scanning light between the first scanning position and the second scanning position according to the fifth embodiment.

FIG. 26A is a diagram showing a change of the light output of the forward scanning light that scans from the first scanning position to the second scanning position according to the seventh embodiment.

FIG. 26B is a diagram showing a change of the light output of the backward scanning light that scans from the second scanning position to the first scanning position according to the seventh embodiment.

FIG. 26C is a diagram showing a change of the appearance of the light amount of the scanning light between the first scanning position and the second scanning position according to the seventh embodiment.

DESCRIPTION OF THE EMBODIMENTS

In regard to embodiments of the invention, a head-up display device 100 for vehicles is described hereinafter with reference to the figures as an example. In the following description, the head-up display device 100 is referred to as "HUD (head-up display) device 100."

First Embodiment

Figure 1:
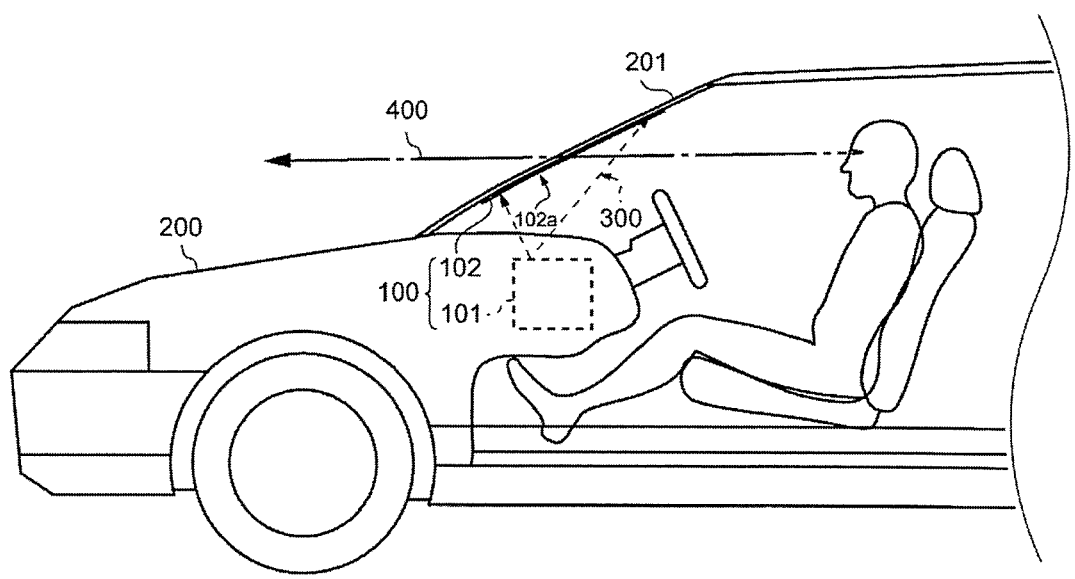
FIG. 1 is a schematic diagram of the HUD device.

FIG. 1 is a schematic diagram of the HUD device 100. The HUD device 100 of this embodiment is installed in a vehicle 200. The HUD device 100 is a display device that projects a scanning laser light 300 (scanning light) from a projector unit 101 (light projection device) to a combiner 102 and overlaps a projection image thereof in a field of view of the user to display it. In FIG. 1, a dashed line arrow 400 indicates a sight line of the user who is sitting in a driver's seat of the vehicle 200. Moreover, the HUD device 100 is not necessarily installed in the vehicle and may also be installed in other means of transportation (such as an airplane and so on).

The combiner 102 is attached to an inner surface of a windshield 201 of the vehicle 200, as shown in FIG. 1. The combiner 102 is a projection member for displaying the projection image of the projector unit 101 in the user's field of view and is formed by using a semi-transmissive reflective material, such as a half mirror. By projecting the scanning laser light 300 from the projector unit 101 to the combiner 102, a virtual image (image) is formed in a predetermined region of a projection surface 102a of the combiner 102. Therefore, the user who is looking to the front of the vehicle 200 (i.e., the direction of the sight line 400) is able to see an image of the outside world in front of the vehicle 200 and the image on the projection surface 102a at the same time.

Figure 2:
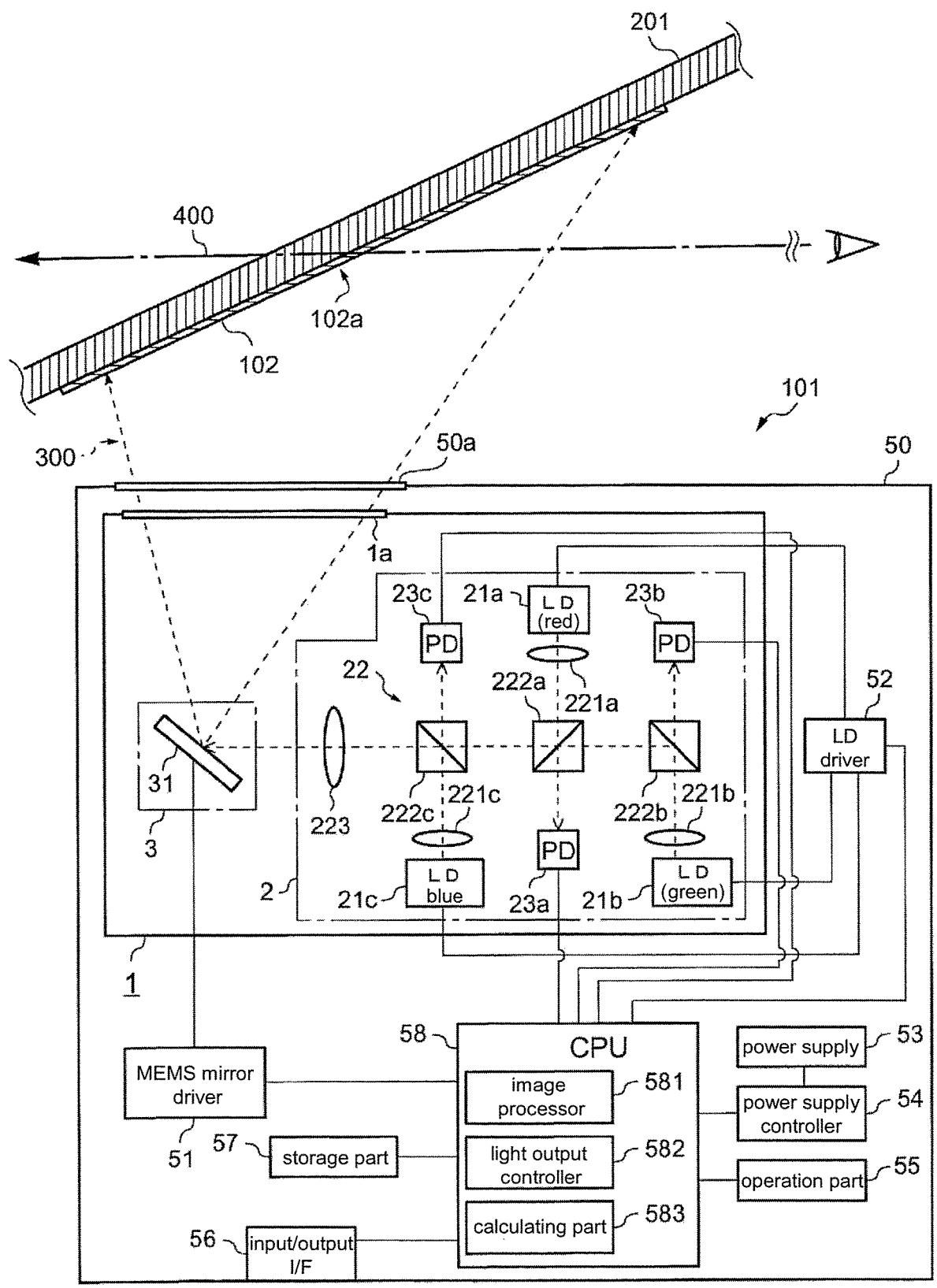
FIG. 2 is a block diagram showing an example of the configuration of the projector unit.

Next, the projector unit 101 is described. FIG. 2 is a block diagram illustrating an example of the configuration of the projector unit 101. As shown in FIG. 2, in the first embodiment, the projector unit 101 includes a housing 1, an optical engine 2, and a MEMS (Micro Electro Mechanical Systems) engine 3.

The housing 1 is equipped with the optical engine 2 and the MEMS engine 3. Moreover, the housing 1 has a window 1a (light transmission window) for emitting the scanning laser light 300 emitted from the MEMS engine 3 to the outside. The window 1a is formed by glass or a translucent resin material, for example. A more specific configuration of the housing 1 is described in detail later.

The optical engine 2 includes a plurality of laser diodes 21a-21c, an optical system 22, and photo detectors 23a-23c, and emits a light to the MEMS engine 3. Hereinafter, the laser diodes 21a-21c are respectively referred to as LD (Laser Diode) 21a-21c, and the photo detectors 23a-23c are respectively referred to as PD (Photo Detector) 23a-23c. Nevertheless, the configuration of the optical engine 2 is not limited to the example shown in FIG. 2. For example, the optical engine 2 may include a half mirror (having a transmittance of 99%, for example) disposed between the optical system 22 and the MEMS engine 3, and a PD (light detector) for detecting a light output of the light reflected by the half mirror, instead of the photo detectors 23a-23c.

The LD 21a is a light emitting element that emits a red laser light. The LD 21b is a light emitting element that emits a green laser light. The LD 21c is a light emitting element that emits a blue laser light.

Figure 3:
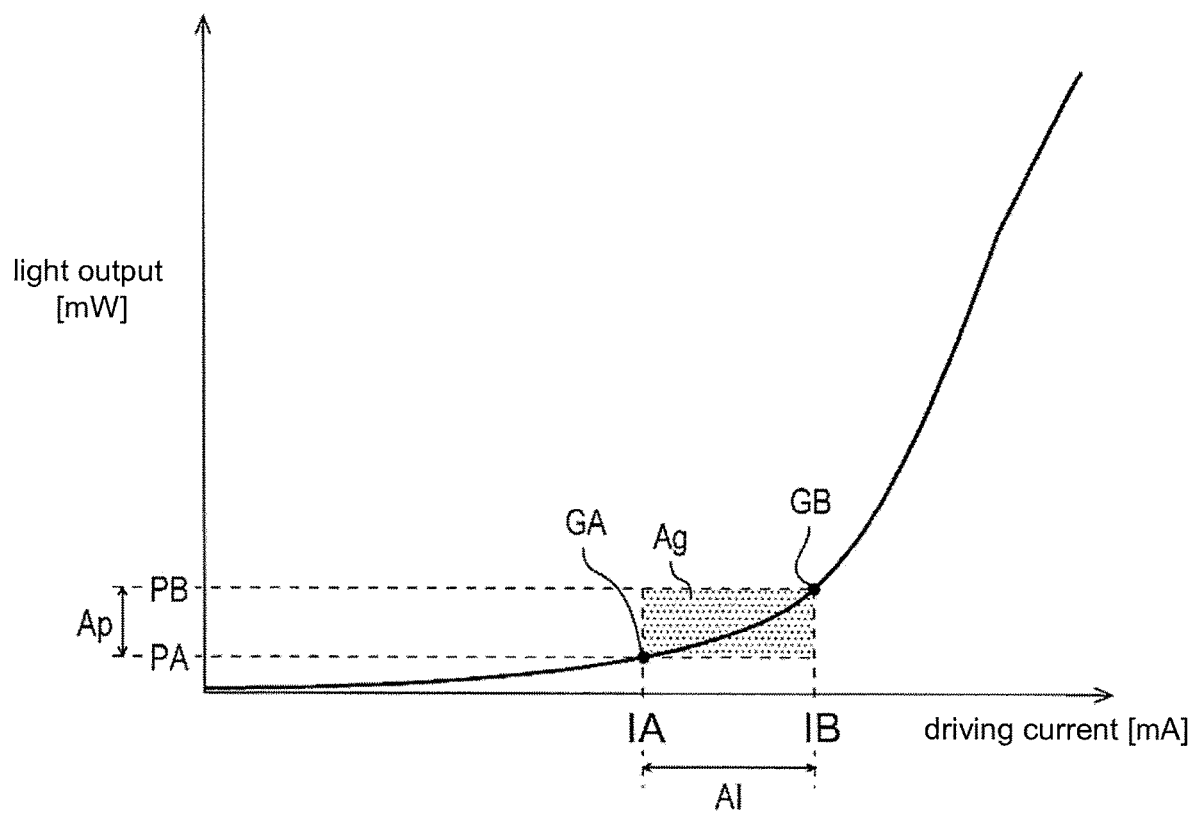
FIG. 3 is a graph showing light output characteristics of the LD with respect to the driving current.

Here, light output characteristics of LD 11a-11c with respect to the driving current are described as follows. The LD 11a is described as an example here. Since the other LD 11b and 11c have the same light output characteristics with respect to the driving current, descriptions thereof are omitted. FIG. 3 is a graph showing the light output characteristics of the LD 11a with respect to the driving current. If a light output of the LD 11a and the driving current applied to the LD 11a are in a dotted rectangular range Ag in FIG. 3, the LD 11a emits light in a state of mixture of a laser oscillation mode and a LED light emitting mode. Thus, the light output of the LD 11a becomes unstable. In addition, the points GA and GB on the graph represent the lower limit and the upper limit of the graph in the range Ag respectively. If the light output and the driving current are less than a light output Pa and a current value Ia corresponding to the lower limit point GA, the LD 11a emits light in the LED light emitting mode. In such a case, the LD 11a outputs an emission light with wavelength and phase less regular than those of the laser oscillation mode, but the light emission is more stable than that in the range Ag. Further, if the light output and the driving current are more than a light output Pb and a current value Ib corresponding to the upper limit point GB, the LD 11a emits light in the LD oscillation mode. In such a case, the LD 11a outputs a coherent light with relatively uniform wavelength and phase due to a stable laser oscillation action.

Figure 4A:
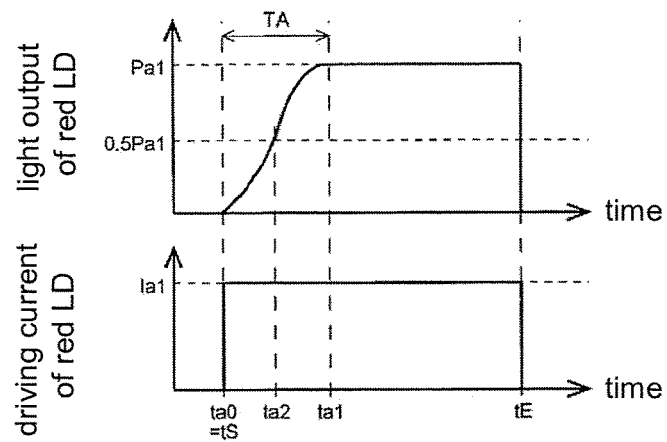
FIG. 4A is a graph showing response characteristics of the light output of the red LD.
Figure 4B:
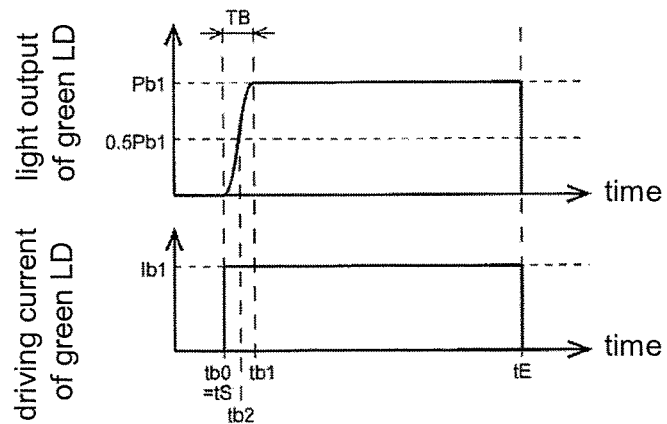
FIG. 4B is a graph showing response characteristics of the light output of the green LD.
Figure 4C:
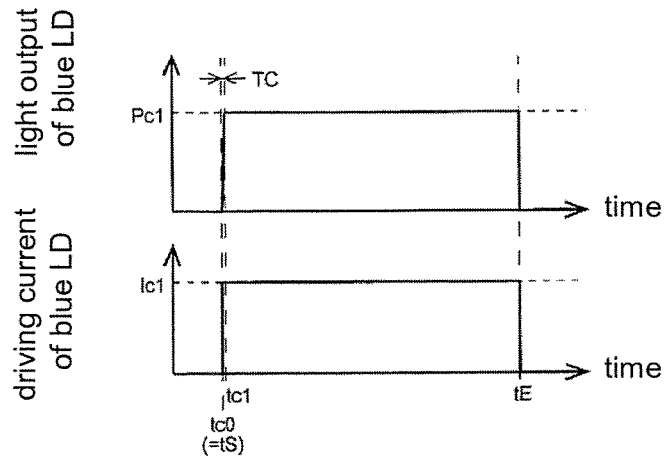
FIG. 4C is a graph showing response characteristics of the light output of the blue LD.

Next, light response characteristics of the LD 11a-11c are described. FIG. 4A to FIG. 4C are graphs showing the response characteristics of the light output of each of the LD 21a-21c applied with the fixed driving currents Ia1-Ic1. FIG. 4A is a graph showing the response characteristics of the light output of the red LD 21a. FIG. 4B is a graph showing the response characteristics of the light output of the green LD 21b. FIG. 4C is a graph showing the response characteristics of the light output of the blue LD 21c. In FIG. 4A to FIG. 4C, a time tS represents a time of starting application of a driving current I (i.e., start light emission) while a time tE represents a time of ending application of the driving current (i.e., end light emission). The same applies to the other figures.

As shown in FIG. 4A to FIG. 4C, the light outputs of the LD 21a-21c have different response characteristics. For example, the LD 21a-21c respectively have a light emission delay when application of the driving current I starts. The light emission delay refers to a phenomenon that, at the beginning of application of the driving current to each of the LD 21a-21c, only a low amount of light is outputted and it takes rising times TA, TB, and TC for the outputted lights to reach constant light amounts Pa1, Pb1, and Pc1 that correspond to the current values Ia1, Ib1, and Ic1 of the applied driving currents. Each of the rising times TA, TB, and TC is a light response time from a time when the light emission starts (application of the driving current starts) to a time when the light output reaches the light amounts Pa1, Pb1, and Pc1 corresponding to the current values Ia1, Ib1, and Ic1 of the driving currents. Time lengths of the rising times TA, TB, and TC differ from one another among the LD 21a-21c.

Described hereinafter are the response characteristics of the light outputs of the LD 21a-21c in a case where the LD 21a-21c perform white display from a state of a light amount 0 (i.e., a state where the light output is 0).

In terms of the red LD 21a, as shown in FIG. 4A, when the fixed driving current Ia1 is applied at a time ta0 (=tS), the rising time TA (=ta1−ta0) is required for the light emission to reach the constant light amount Pa1 that corresponds to the driving current Ia1. That is, the light output of the red LD 21a gradually increases from the time ta0, reaches half (0.5Pa) of the constant light amount at a time tat, and then reaches the constant light amount Pa1 at the time ta1. The constant light amount Pa1 is the light amount Pa1 of the LD 21a when the LD 21a-21c perform white display, for example. Thus, among the LD 21a-21c, the red LD 21a has the longest rising time TA that is required for the outputted light to reach the constant light amount Pa1 from the state that the light amount is 0.

Further, in terms of the green LD 21b, as shown in FIG. 4B, when the fixed driving current Ib1 is applied at a time tb0 (=tS), the rising time TB (=tb1−tb0) is required for the light emission to reach the constant light output Pb1 that corresponds to the driving current Ib1. That is, the light output of the green LD 21b increases from the time tb0, reaches half (0.5Pb) of the constant light amount Pb1 at a time tb2, and then reaches the constant light output Pb1 at the time tb1. The constant light amount Pb1 is the light amount Pb1 of the LD 21b when the LD 21a-21c perform white display, for example. However, the rising time TB of the green LD 21b is shorter than the rising time TA of the red LD 21a (0<TB<TA).

In terms of the blue LD 21c, as shown in FIG. 4C, the light output has very good response characteristics, and when the fixed driving current Ic1 is applied at a time tc0 (=tS), the light emission reaches the constant light output Pc1 corresponding to the driving current Ic1 immediately. That is, for the blue LD 21c, the rising time TC is hardly required (TC≈0). The constant light amount Pc1 is the light amount Pa of the LD 21c when the LD 21a-21c perform white display, for example.

Next, the optical engine 2 is described with reference to FIG. 2 again. The optical system 22 includes collimator lenses 221a-221c, beam splitters 222a-222c, and a condenser lens 223. The collimator lenses 221a-221c are optical elements for converting the laser light emitted from each of the LD 21a-21c into a parallel light. In addition, the beam splitters 222a-222c are optical elements, such as dichroic mirror, and reflect a light of a specific wavelength while allowing lights of other wavelengths to pass through. Moreover, the beam splitters 222a-222c reflect a portion of the light that is incident from the collimator lenses 221a-221c respectively and allow a portion of the remaining light to pass through. The PD 23a-23c are light detectors for detecting the light output of the light that is incident from the beam splitters 222a-222c respectively, and output a light detection signal based on the detection result to a CPU 58, which will be described later.

The red laser light emitted from the LD 21a is converted into a parallel light by the collimator lens 221a. A portion of the red laser light is reflected by the beam splitter 222a and passes through the beam splitter 222c to reach the condenser lens 223. A portion of the remaining red laser light passes through the beam splitter 222a and is incident to the PD 23a. In addition, the green laser light emitted from the LD 21b is converted into a parallel light by the collimator lens 221b. A portion of the green laser light is reflected by the beam splitter 222b and passes through the beam splitters 222a and 222c to reach the condenser lens 223. A portion of the remaining green laser light passes through the beam splitter 222b and is incident to the PD 23b. Moreover, the blue laser light emitted from the LD 21c is converted into a parallel light by the collimator lens 221c. A portion of the blue laser light is reflected by the beam splitter 222c and reaches the condenser lens 223. A portion of the remaining blue laser light passes through the beam splitter 222c and is incident to the PD 23c. The condenser lens 223 converges the laser lights that are incident from the LD 21a-21c through the collimator lenses 221a-221c and the beam splitters 222a-222c onto a light reflective surface of a MEMS mirror 31.

The MEMS engine 3 includes the MEMS mirror 31 and is a scanning optical unit for swingly driving the scanning laser light 300, which is projected to the projection surface 102a of the combiner 102 from the LD 21a-21c, and an optical axis thereof to scan the projection surface 102a. The MEMS mirror 31 is an optical reflective element for reflecting the laser light converged by the condenser lens 223. The MEMS mirror 31 reflects each laser light as the scanning laser light 300. The scanning laser light 300 is emitted to the outside of the projector unit 101 through the window 1a of the housing 1 and a light emitting exit 50a (which will be described later) to be projected to the projection surface 102a of the combiner 102. Moreover, the MEMS mirror 31 swingly drives in two axial directions to change the optical axis of the scanning laser light 300, so as to scan the scanning laser light 300 on the projection surface 102a. Thus, the MEMS mirror 31 swingly drives the optical axis of the scanning laser light 300 in a horizontal direction and a vertical direction of the combiner 102 to scan the scanning laser light 300 that is projected to the projection surface 102a.

Figure 5:
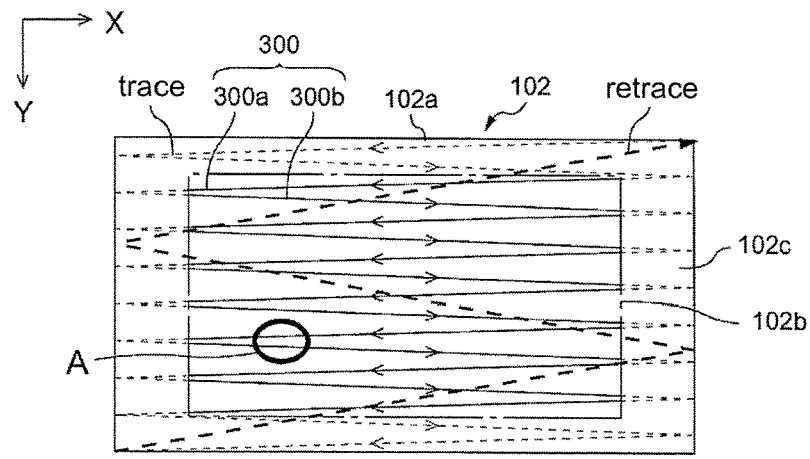
FIG. 5 is a diagram showing the scanning condition of the scanning laser light on the projection surface of the combiner.

FIG. 5 is a diagram illustrating a scanning condition of the scanning laser light 300 and the optical axis thereof on the projection surface 102a of the combiner 102. With respect to the projection surface 102a, a horizontal direction toward the right side of the projection surface 102a may be referred to as an X direction and a vertical direction toward the lower side of the projection surface 102a may be referred to as a Y direction hereinafter. The same applies to the other figures.

The scanning laser light 300 has a direction range in the vertical direction Y and scans reciprocally in the horizontal direction X, as shown in FIG. 5 for example, on the projection surface 102a by the oscillatory driving of the MEMS mirror 31. That is, the optical axis of the scanning laser light 300 alternately performs a zigzag reciprocal scanning toward the Y direction and a zigzag reciprocal scanning toward a −Y direction. Hereinafter, the zigzag reciprocal scanning in the Y direction from the uppermost side to the lowermost side of FIG. 5 is referred to as a trace. Besides, the zigzag reciprocal scanning in the −Y direction from the lowermost side to the uppermost side of FIG. 5 is referred to as a retrace.

During the trace, the image is formed on the projection surface 102a by a group of the scanning laser lights 300 having the direction range in the vertical direction Y and reciprocally scanning in the horizontal direction X. That is, the image is formed by a group of the scanning laser lights 300 that alternately perform scanning of a −X direction having a predetermined Y direction component and scanning of the X direction having the predetermined Y direction component. Hereinafter, the scanning laser light 300 having the predetermined Y direction component and scanning in the −X direction is referred to as a scanning laser light 300a of a forward scan (a forward scanning laser light 300a).

Moreover, the scanning laser light 300 having the predetermined Y direction component and scanning in the X direction is referred to as a backward scanning laser light 300b of a backward scan (a backward scanning laser light 300b). The predetermined Y direction component of each of the scanning laser lights 300a and 300b is determined according to a scanning pitch (i.e., scanning interval) of each of the scanning laser lights 300a and 300b in the Y direction.

In FIG. 5, a region of the projection surface 102a, which is surrounded by the dash-dotted line, is a valid projection region 102b. A region other than the projection region 102b is an invalid projection region 102c. The valid projection region 102b is a region where the image can be formed by the scanning laser light 300 during a trace period. The image is not formed during a retrace period. In addition, the invalid projection region 102c is a region where no image is formed during the trace period and the retrace period. Although the optical axis of the scanning laser light 300 scans in the region 102c, the scanning laser light 300 itself, which is for forming the image, is not projected to the region 102c.

Next, the configuration of the projector unit 101 is further described with reference to FIG. 2. The projector unit 101 further includes a main body casing 50, a MEMS mirror driver 51, a LD driver 52, a power supply 53, a power supply controller 54, an operation part 55, an input/output I/F 56, a storage part 57, and the CPU 58.

The housing 1, the MEMS mirror driver 51, the LD driver 52, the power supply 53, the power supply controller 54, the operation part 55, the input/output I/F 56, the storage part 57, and the CPU 58 are disposed in the main body casing 50. In addition, the light emitting port 50a is formed on the main body casing 50. The scanning laser light 300 that has passed through the window 1a of the housing 1 from the MEMS engine 3 further passes through the light emitting exit 50a to be emitted to the combiner 102. The light emitting exit 50a may be an opening, but is preferably formed by glass or a translucent resin material, for example. In this way, dust, water (e.g., water droplets and air containing moisture), and so on can be prevented from entering the interior of the main body housing 50.

The MEMS mirror driver 51 is a drive controller that controls driving of the MEMS mirror 31 based on a control signal inputted from the CPU 58. For example, the MEMS mirror driver 51 swingly drives the MEMS mirror 31 in response to a horizontal synchronization signal from the CPU 58 to change a reflection direction of the laser light reflected by the MEMS mirror 31 in the horizontal direction of the projection surface 102a. Further, the MEMS mirror driver 51 swingly drives the MEMS mirror 31 in response to a vertical synchronization signal from the CPU 58 to change the reflection direction of the laser light reflected by the MEMS mirror 31 in the vertical direction of the projection surface 102a.

The LD driver 52 is a light source driving part that provides driving currents to LD 21a-21c respectively and performs driving control for light emission and light output of each of the LD 21a-21c. The LD driver 52 is a part of the light output controlling unit of the invention, and for example, provides the driving currents larger than oscillation threshold currents (for example, the current IB in FIG. 3) to the LD 21a-21c respectively and makes LD 21a-21c output laser light. The power supply 53 is a power supply part that is supplied with electric power from an electric power source, such as a storage battery (not shown) of the vehicle 200. The power supply controller 54 converts the electric power supplied from the power supply 53 into predetermined voltage values and current values corresponding to each component of the projector unit 101 and supplies the converted electric power to each component. The operation part 55 is an input unit that receives an operation input of the user. The input/output I/F 56 is a communication interface for wired communication or wireless communication with an external device.

The storage part 57 is a non-volatile storage medium, which stores programs and control information to be used by each component of the projector unit 101, for example. In addition, the storage part 57 also stores image information to be projected to the combiner 102, information related to operation characteristics of the LD 21a-21c and light amount correction (for example, response characteristics of the light output which will be described later), and so on.

The CPU 58 is a controller that uses the programs and control information stored in the storage part 57 to control each component of the projector unit 101. The CPU 58 has an image processor 581, a light output controller 582, and a calculating part 583, as shown in FIG. 2. The CPU 58 is a part of the light output controlling unit of the invention.

The image processor 581 generates image information based on the programs stored in the storage part 57, information inputted from the input/output I/F 56, information stored in the storage part 57, and so on. The image processor 581 also converts the generated image information into image data of three colors, i.e., red (R), green (G), and blue (B). The converted three-color image data is outputted to the light output controller 582.

The light output controller 582 controls the light output of the LD 21a-21c. For example, the light output controller 582 imports the image data outputted from the image processor 581 (i.e., image information of the image formed on the projection surface 102a) into a memory (not shown) to perform an image analysis. That is, color information, brightness information, and so on of the image formed on the projection surface 102a are analyzed. Further, the light output controller 582 generates a light control signal for each of the LD 21a-21c based on a result of the analysis and the information related to the operation characteristics of the LD 21a-21c, and outputs it to the LD driver 52. The laser light emitted from each of the LD 21a-21c based on each light control signal scans two-dimensionally because of driving of the MEMS mirror 31, by which an image based on the image information is projected to the combiner 102 on the windshield 201.

The calculating part 583 performs various operations based on the response characteristics of the light outputs of the LD 21a-21c. For example, the calculating part 583 calculates the rising times TA, TB, and TC (to be described later) of the LD 21a-21c, based on the detection results of the PD 23a-23c. Then, the calculating part 583 calculates the times ta0, tb0, and tc0 (light emission start time) of applying the driving currents Ia1, Ib1, and Ic1 to the LD 21a-21c and a time difference thereof by using the rising times TA, TB, and TC.

Figure 6:
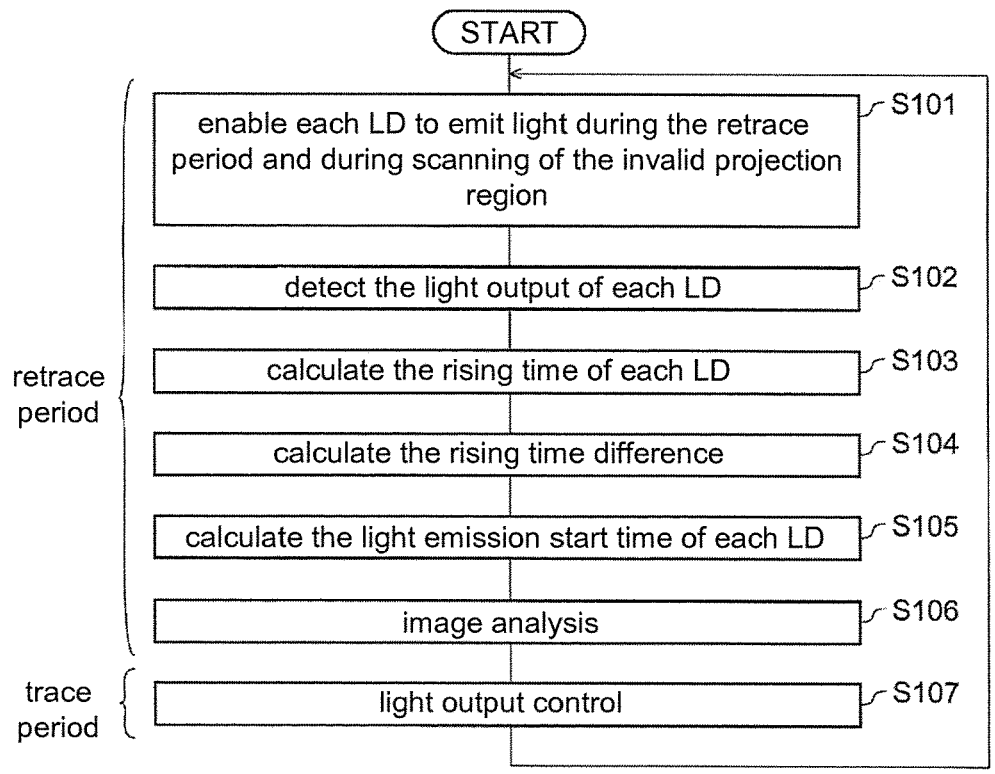
FIG. 6 is a flowchart for explaining an example of the light output control process of the LD.

Next, a light output control process for the LD 21a-21c is described. FIG. 6 is a flowchart for explaining an example of the light output control process of the LD 21a-21c according to the first embodiment. The steps S101-S106 described below are performed in the retrace period and the step S107 is performed in the trace period. In addition, the light output control process exemplified in FIG. 6 is also applicable to the second and the third embodiments described later.

First, in the retrace period, when the optical axis of the scanning laser light 300 scans the invalid projection region 102c, the light output controller 582 applies the predetermined driving currents Ia1-Ic1 to the LD 21a-21c in a predetermined time. That is, the light output controller 582 enables each of the LD 21a-21c to perform light output at the predetermined light amount (Pa1, Pb1, and Pc1, for example) (S101). The application times of the driving currents Ia1-Ic1 are longer than the rising times TA, TB, and TC of the LD 21a-21c respectively. Then, the PD 23a-23c detect the light outputs of the LD 21a-21c (S102). The calculating part 583 calculates the rising times TA, TB, and TC of the LD 21a-21c, based on the detection results of the PD 23a-23c (S103). Then, the calculating part 583 calculates time differences TB1 (=TA−TB) and TC1 (=TA−TC≈TA) between the longest rising time TA and the other rising times TB and TC (S104). Further, the calculating part 583 obtains the light emission start times tb0 and tc0 of the LD 21b and 21c, based on the time differences TB1 and TC1 (S105). The light output controller 582 imports the image data outputted from the image processor 581 into a memory (not shown) and performs an image analysis on the image projected to the projection surface 102a in the trace period based on the image data (S106). That is, the color information, brightness information, and so on of the image formed in the trace period are analyzed.

Next, in the trace period, the light output controller 582 performs light output control over the LD 21a-21c based on the result of the image analysis, the calculation result of the calculating part 583, the information stored in the storage part 57, and so on (S106).

In the aforementioned light output control process, S104 may be performed after the light output controller 582 specifies the LD that has the longest rising time. In that case, the time difference between the specified LD and the other LD is obtained. Usually, the rising time TA of the red LD 21a is the longest. However, the rising times TB and TC of the LD 21a-21c may change due to the state of the elements (such as temperature change, degradation, and so on). Accordingly, if the light output controller 582 functions as an element specifying part for specifying the LD having the longest rising time, as described above, the light output controller 582 can perform the same light output control even when the rising time TB of the LD 21b or the rising time TC of the LD 21c is the longest. That is, the light output control can be performed such that the times ta1, tb1, and tc1 when the LD 21a-21c respectively reach the constant light amounts Pa1, Pb1, and Pc1 are the same.

A comparative example and embodiments regarding the light output control of the LD 21a-21c in the case of performing white display from the state of the light amount being 0 (i.e., the state where the light output is 0) are described in detail hereinafter.

Comparative Example

Figure 7:
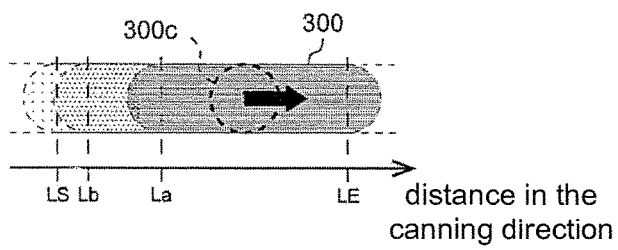
FIG. 7 is a schematic diagram showing the light output of the scanning laser light when all LD perform light output at the same time.

The comparative example is explained first. As described above, the rising times TA, TB, and TC at the start of the light emission differ depending on the LD 21a-21c (refer to FIG. 4A to FIG. 4C). Accordingly, when the LD 21a-21c perform light output at the same time, color unevenness clearly occurs in a predetermined period after the light emission start time tS. FIG. 7 is a schematic diagram showing the light output of the scanning laser light 300 when all the LD 21a-21c perform light output at the same time. In FIG. 7, positions LS, Lb, La, and LE respectively indicate a center position of a light spot 300c of the scanning laser light 300 in the scanning direction of the scanning laser light 300. The position LS is the center position of the light spot 300c at the light emission start time tS of the LD 21a-21c. The position Lb is the center position of the light spot 300c at the time tb1 of the LD 21a-21c. The position La is the center position of the light spot 300c at the time ta1 of the LD 21a-21c. The position LE is the center position of the light spot 300c at the light emission end time tE of the LD 21a-21c. The same applies to FIG. 9, which will be described later.

The scanning laser light 300 projected to the projection surface 102a, as shown in FIG. 7, clearly has color unevenness between the positions LS and La. The range between the positions LS and La corresponds to the period TA which is from the light emission start time tS of each of the LD 21a-21c to the time ta1 when the rising time TA of the red LD 21a has passed. That is, at the position LS at the light emission start time tS, the scanning laser light 300 has almost only the blue component. In the range from the position LS to the position Lb, the red and green components of the scanning laser light 300 gradually increase, but the blue component has the constant light amount Pc1. The green component reaches the constant light amount Pb1 corresponding to the driving current Ib1 at the position Lb, but the light amount of the red component of the scanning laser light 300 is still small and less than the constant light amount Pa1. Then, the red component of the scanning laser light 300 increases in the range from the position Lb to the position La, and the red component reaches the constant light amount Pa1 corresponding to the driving current Ia1 at the position La.

EMBODIMENTS

Figure 8:
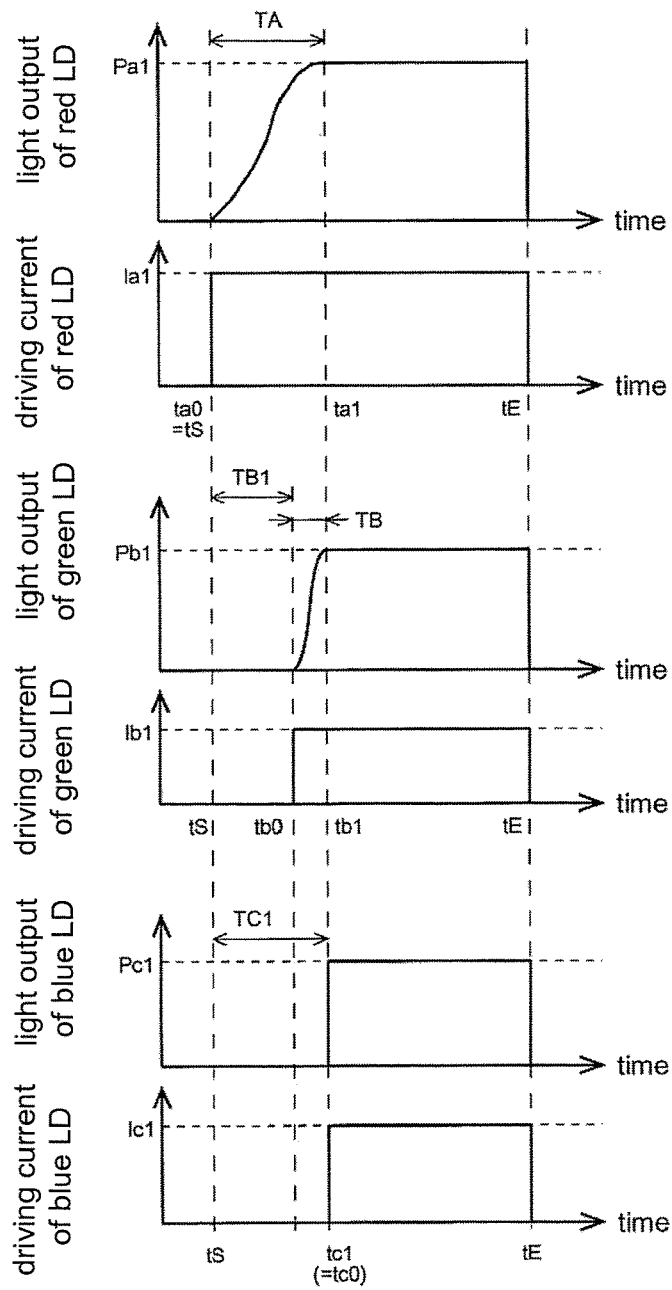
FIG. 8 is a graph showing an example of the light output control of the LD according to the first embodiment.

Then, the embodiments are described. FIG. 8 is a graph showing an example of the light output control of the LD 21a-21c according to the first embodiment. In addition, FIG. 9 is a schematic diagram showing an example of the light output of the scanning laser light 300 when light output control is performed according to the first embodiment.

As shown in FIG. 8, in this embodiment, when the image is formed by the light outputs of the LD 21a-21c, the driving currents Ia1, Ib1, and Ic1 are applied to the LD 21a-21c such that the times ta1, tb1, and tc1 (=tc0) when the LD 21a-21c respectively reach the constant light amounts Pa1, Pb1, and Pc1 corresponding to the driving currents Ia1, Ib1, and Ic1 are the same. That is, the light output controller 582 sets the time ta0 when application of the driving current to the LD 21a having the longest rising time TA among the LD 21a-21c starts to be earlier than the times tb0 and tc0 when application of the driving currents to the other LD 21b and 21c starts, based on the respective time differences between the rising times TA, TB, and TC of the LD 21a-21c. In addition, the light output controller 582 sets the time ta0 when the driving current Ia1 for enabling the LD 21a to output light at the constant light amount Pa1 is applied to the LD 21a to be earlier than the times tb0 and tc0 when the driving currents Ib1 and Ic1 for enabling the other LD 21b and 21c to output light respectively at the constant light amounts Pb1 and Pc1 are respectively applied to the LD 21b and 21c, based on the time differences between the rising times TA, TB, and TC. Then, the light output controller 582 sets the time ta1 when the light amount of the LD 21a reaches the constant light amount Pa1 and the times tb1 and tc1 when the light amounts of the LD 21b and 21c respectively reach the constant light amounts Pb1 and Pc1 to be the same.

In this case, the time ta0 is set to the start time tS of the light output control. The driving current Ib1 is applied to the green LD 21b at the time tb0 when the time difference TB1 (=TA−TB) has passed after the light emission start time ta0 (i.e., the time tS) of the red LD 21a, so as to start the light emission of the green LD 21b. Moreover, the driving current Id is applied to the blue LD 21c at the time tc1 (=ta1) when the time difference TC1 (=TA) has passed after the light emission start time tS, so as to start the light emission of the blue LD 21c.

Figure 9:
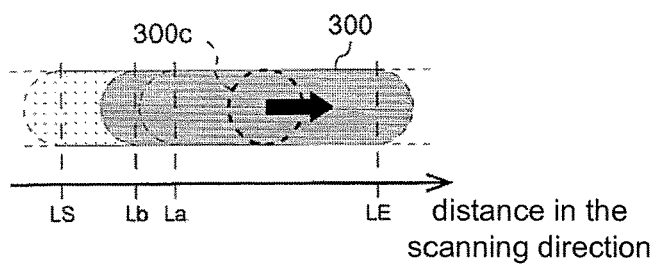
FIG. 9 is a schematic diagram showing an example of the light output of the scanning laser light when light output control is performed according to the first embodiment.

In this way, as shown in FIG. 9, the color unevenness of the scanning laser light 300 between the positions LS and La is significantly reduced as compared with the case where the LD 21a-21c emit light simultaneously (refer to FIG. 7). That is, in the range from the position LS right after the light emission start time tS to the position Lb, the scanning laser light 300 has only a little red component. Therefore, the color unevenness is not noticeable. Further, although the green LD 21b starts to emit light at the position Lb, the red and green components of the scanning laser light 300 are still small. Then, the red and green components of the scanning laser light 300 increase in the range from the position Lb to the position La. The blue LD 21c starts to emit light at the position La, and the red, green, and blue components reach the constant light amounts Pa1, Pb1, and Pc1 corresponding to the driving currents Ia1, Ib1, and Ic1 that are applied to the LD 21a-21c.

Second Embodiment

The second embodiment is described hereinafter. In the second embodiment, the light output controller 582 performs light output control over the LD 21a-21c such that the times ta2, tb2, and tc2 (=tc0) when the LD 21a-21c respectively reach half of the constant light amounts (i.e., 0.5Pa, 0.5Pb, and 0.5Pc) are the same. Otherwise, the second embodiment is the same as the first embodiment. The configuration different from that of the first embodiment is described hereinafter. In addition, components the same as those of the first embodiment are assigned with the same reference numerals, and descriptions thereof are omitted.

Figure 10:
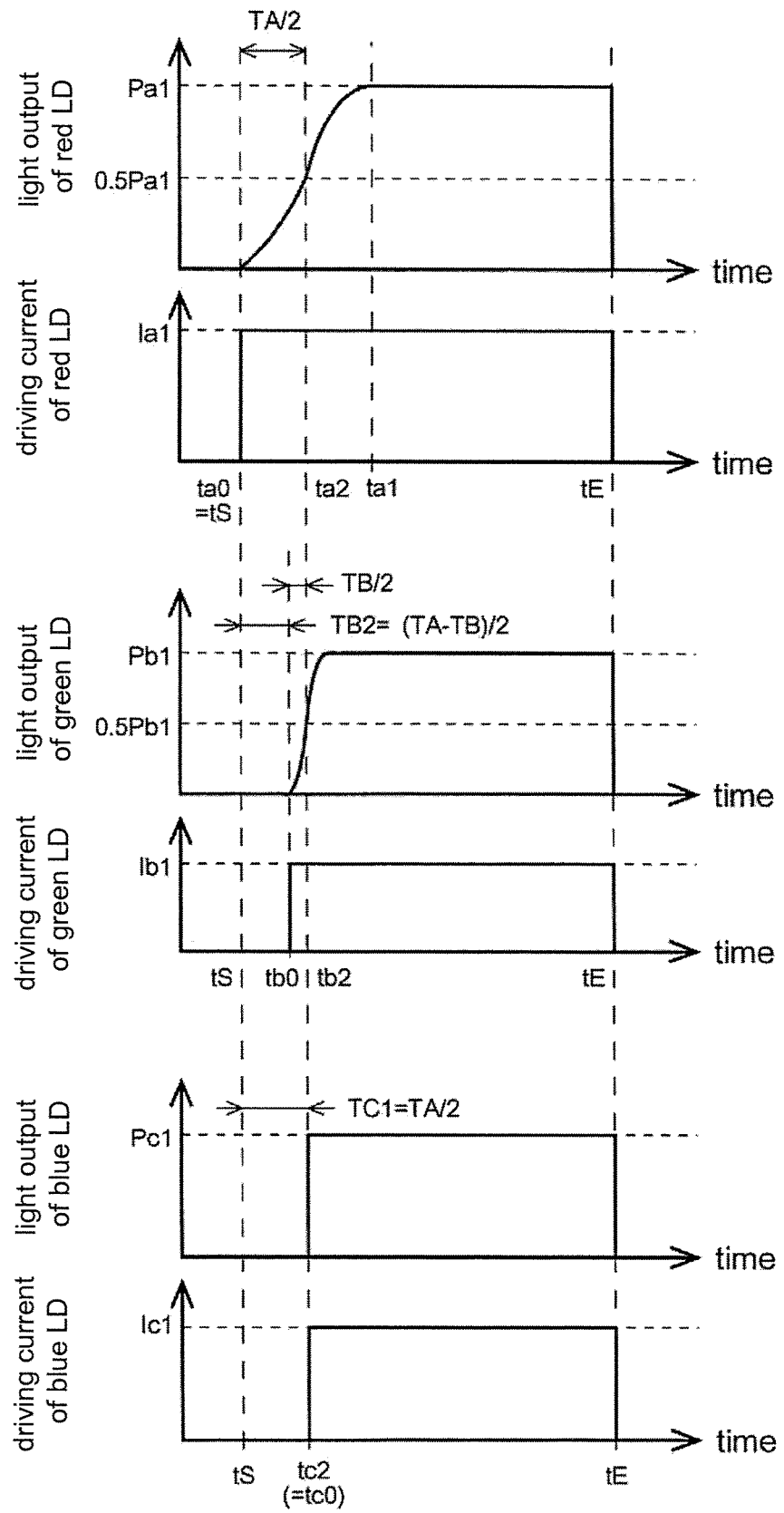
FIG. 10 is a graph showing an example of the light output control of the LD according to the second embodiment.

FIG. 10 is a graph showing an example of the light output control of the LD 21a-21c according to the second embodiment. FIG. 10 illustrates the response characteristics of the light outputs of the LD 21a-21c when the LD 21a-21c perform white display from the state of the light amount 0, for example. As shown in FIG. 10, the time ta0 when the driving current Ia1 for enabling the LD 21a to output light at the constant light amount Pa1 is applied to the LD 21a is earlier than the times tb0 and tc0 when the driving currents Ib1 and Ic1 for enabling the other LD 21b and 21c to output light respectively at the constant light amounts Pb1 and Pc1 are respectively applied to the LD 21b and 21c, based on half of the rising times (i.e., (TA/2), (TB/2), and (TC/2)).

Besides, as shown in FIG. 10, the driving currents Ia1, Ib1, and Ic1 are respectively applied to the LD 21a-21c such that the times ta2, tb2, and tc2 are the same. That is, the light output controller 582 sets the time ta2 when the LD 21a reaches half of the constant light amount 0.5Pa1, the time tb2 when the LD 21b reaches half of the constant light amount 0.5Pb1, and the time tc2 (=tc0) to be the same, based on the respective time differences between the rising times TA, TB, and TC of the LD 21a-21c. In other words, the light output controller 582 sets the time ta2 when the light amount of the LD 21a reaches a percentage of 50% of the constant light amount Pa1 and the time tb2 when the light amount of the LD 21b reaches a percentage of 50% of the constant light amount Pb1 to be the same, based on the respective time differences between the rising times TA and TB of the LD 21a-21c. Since the LD 21c hardly has the rising time TC, the time tc2 when half of the constant light amount of the LD 21c reaches 0.5Pc1 (i.e., the time when a percentage of 50% of the constant light amount Pc1 is reached) is regarded the same as the time tc0.

In this case, first, the light emission start time ta0 of the LD 21a that has the longest rising time is set to the start time tS of the light output control. Then, the driving current Ia1 is applied to the red LD 21a to start the light emission. The driving current Ib1 is applied to the green LD 21b at the time tb0 when the time TB2 (=(TA−TB)/2) has passed after the light emission start time ta0 of the red LD 21a, so as to start the light emission of the green LD 21b. For the blue LD 21c, the rising time TC is hardly required (i.e., TC≈0). Therefore, the driving current Id is applied to the blue LD 21c at the time ta2 when the time TC2 (=TA/2) has passed after the light emission start time tS, so as to start the light emission of the blue LD 21c.

This embodiment illustrates the example that the times ta2, tb2, and tc2 are set to be the same. Nevertheless, the invention is not limited to this example. The times tb2 and tc2 may be later than the time ta2 and earlier than the time ta1. That is, the time when the light amount of the LD 21a reaches a predetermined percentage of the first light amount Pa1 and the time when the light amounts of the LD 21b and 21c respectively reach the predetermined percentage of the first light amount Pb1 and Pc1 may be set to be the same based on the time differences between the rising times TA, TB, and TC.

By doing so, the color unevenness of the scanning laser light 300 in the period TA from the light emission start time ta0 of the LD 21a to the time ta1 can be significantly reduced as compared with the case where the LD 21a-21c emit light simultaneously (refer to FIG. 7).

Third Embodiment

The third embodiment is described hereinafter. In the third embodiment, with the exception of the red LD 21a that has the longest rising time TA, the green LD 21b and the blue LD 21c are applied with the driving currents Ib1 and Ic1 that are increased stepwise, so as to reduce the color unevenness of the scanning laser light 300. Otherwise, the third embodiment is the same as the first embodiment. The configuration different from those of the first and second embodiments is described hereinafter. In addition, components the same as those of the first and second embodiments are assigned with the same reference numerals, and descriptions thereof are omitted.

Figure 11:
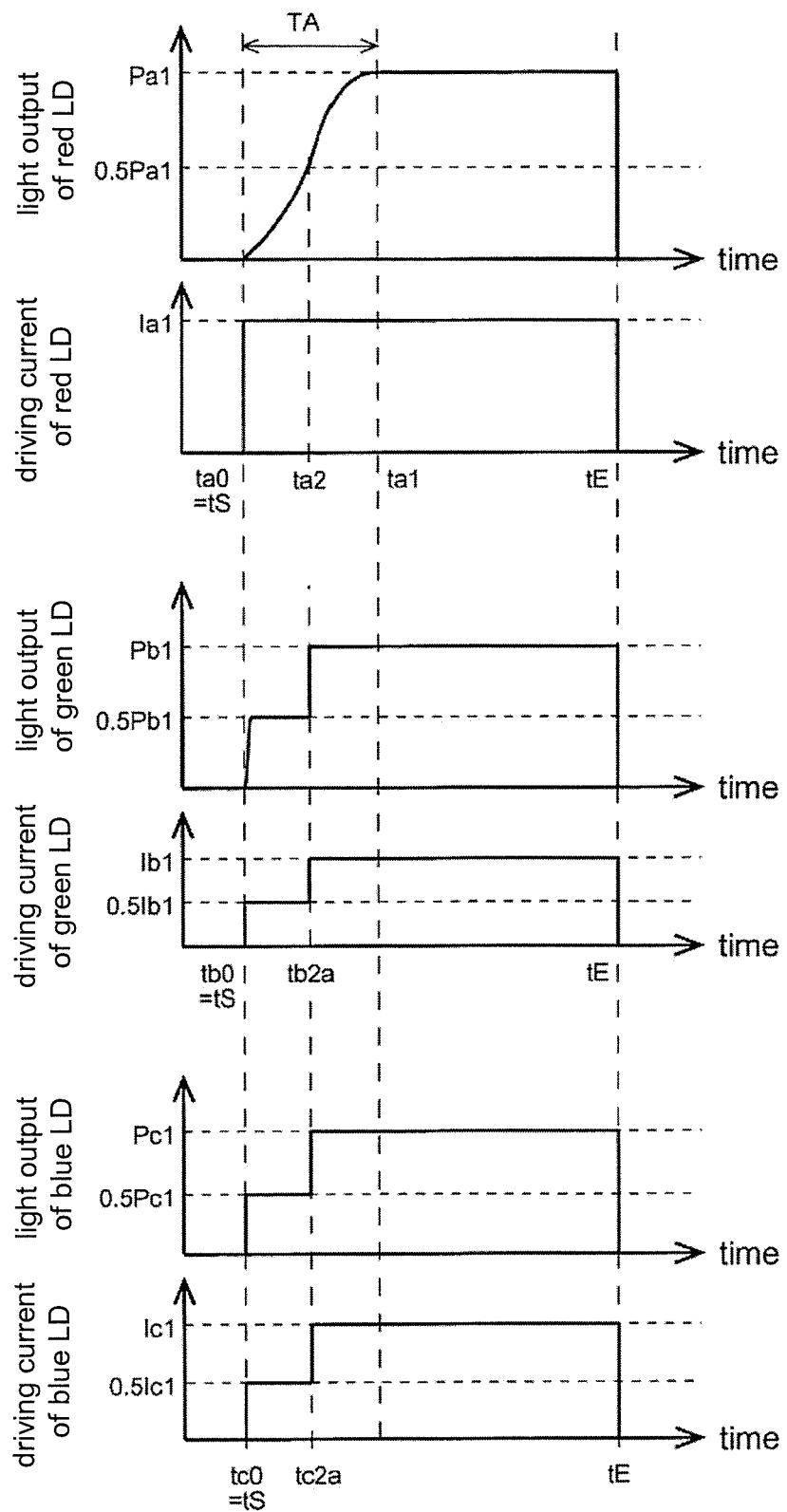
FIG. 11 is a graph showing an example of the light output control of the LD according to the third embodiment.

FIG. 11 is a graph showing an example of the light output control of the LD 21a-21c according to the third embodiment. FIG. 11 illustrates the response characteristics of the light outputs of the LD 21a-21c when the LD 21a-21c perform white display from the state of the light amount 0, for example. Besides, in FIG. 11, the application start times ta0, tb0, and tc0 of the driving currents Ia1, Ib1, and Ic1 are the time tS. In the period between the times tS and tE, the red LD 21a is applied with the fixed driving current Ia1. In the same period, the green LD 21b and the blue LD 21c are applied with driving currents that increase in two stages. In this case, however, the time ta0 when the driving current Ia1 for enabling the LD 21a to output light of the constant light amount Pa1 is applied to the LD 21a is set to be earlier than the times tb3 and tc3 when the driving currents Ib1 and Ic1 for enabling the other LD 21b and 21c to output lights of the constant light amounts Pb1 and Pc1 are respectively applied to the LD 21b and 21c.

That is, the light output controller 582 applies to the green LD 21b a driving current having the current value (e.g., 0.5Ib1) corresponding to the light amount (e.g., 0.5Pb1) that is less than the constant light amount Pb1 at the time tb0 (=tS). Thereafter, the light output controller 582 applies to the LD 21b a driving current having the current value Ib1 corresponding to the constant light amount Pb1 at the time tb3 (=ta0+TA/2) when the light amount of the LD 21a reaches half of the constant value (i.e., 0.5Pa1).

Likewise, the light output controller 582 applies to the LD 21c a driving current having the current value (e.g., 0.5Ic1) corresponding to the light amount (e.g., 0.5Pc) that is less than the constant light amount Pc1 at the time tc0 (=tS). Thereafter, the light output controller 582 applies to the LD 21c a driving current having the current value Ic1 corresponding to the constant light amount Pc1 at the time tc3 (=ta0+TA/2) when the light amount of the LD 21a reaches half of the constant value (i.e., 0.5Pa1).

In the case of increasing the driving currents Ib1 and Ic1 in two stages, as shown in FIG. 11, the times tb3 and tc3 of increasing the current values applied to the LD 21b and 21c are preferably the same as or around the time ta2 (=tS+TA/2) when the LD 21a reaches half of the constant light amount (i.e., 0.5Pa1). In this way, changes of the light outputs of the LD 21b and 21c during the rising time TA (i.e., the period from the time ta0 to the time ta1) of the LD 21a can be close to the change of the light output of the LD 21a.

Modified Example of the Third Embodiment

Figure 12:
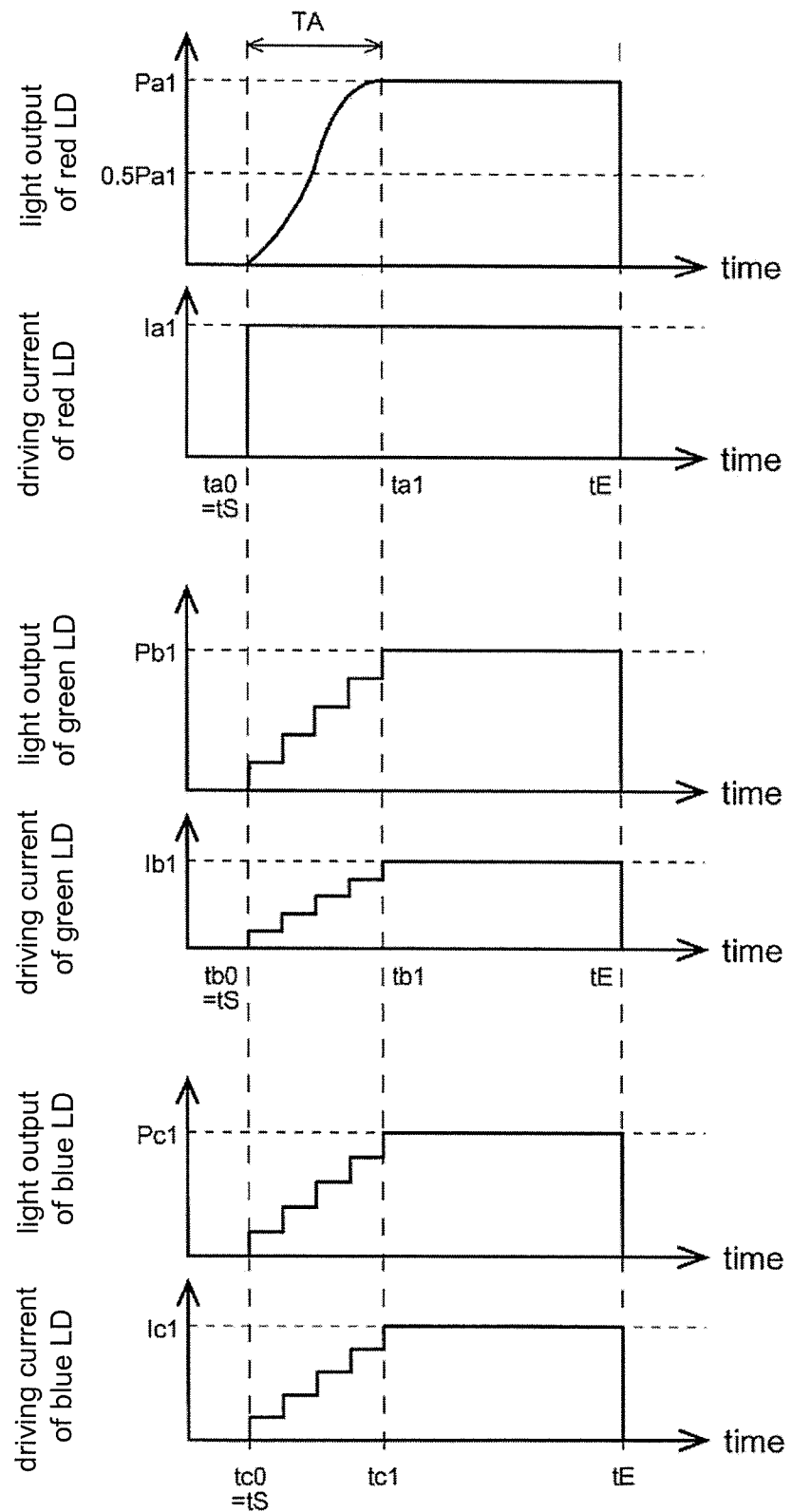
FIG. 12 is a graph showing another example of the light output control of the LD according to the third embodiment.

FIG. 12 is a graph showing an example of the light output control of the LD 21a-21c according to the modified example of the third embodiment. FIG. 12 illustrates the response characteristics of the light outputs of the LD 21a-21c when the LD 21a-21c perform white display from the state of the light amount 0, for example. As shown in FIG. 12, the driving current to be applied to the green LD 21b may also be increased in a plurality of stages (3 or more) up to the current value Ib1. Likewise, the driving current to be applied to the blue LD 21c may also be increased in a plurality of stages (3 or more) up to the current value Ic1. In this case, however, the time ta0 when the driving current Ia1 for enabling the LD 21a to output light of the constant light amount Pa1 is applied to the LD 21a is set to be earlier than the times tb1 and tc1 when the driving currents Ib1 and Id for enabling the other LD 21b and 21c to output lights of the constant light amounts Pb1 and Pc1 are respectively applied to the LD 21b and 21c.

Further, as shown in FIG. 11 and FIG. 12, in the case where the current values applied to the LD 21b and 21c are increased in multiple stages, an increase amount of the current value in each stage may be the same or different from one another. In addition, the timings of increasing the current values may have constant or different intervals. The increase amount and the timing of increase are preferably set to approximate to the change of the light output (i.e., the increasing tendency of the light amount) of the LD 21a during the rising time TA. In this way, the changes of the light outputs of the LD 21b and 21c during the rising time TA of the LD 21a can be closer to and approximate to the change of the light output of the LD 21a. Accordingly, occurrence of color unevenness (e.g., collapse of white balance) of the scanning laser light 300 can be significantly suppressed or prevented during the period that all the LD 21a-21c reach the constant light amounts after the start of light emission of the LD 21a-21c.

Conclusion of the First to the Third Embodiments

According to the first to the third embodiments described above, the projector unit 101 includes the multiple LD 21a-21c and the light output controlling unit. The light output controlling unit includes the light output controller 582 that controls the light output of the multiple LD 21a-21c. In the case of performing the white display from the state of the light amount being 0 by the multiple LD 21a-21c, the light output controller 582 sets the time ta0 of applying to the LD 21a the driving current Ia1 for outputting the light of the light amount Pa1 of the white display from the LD 21a, which has the longest rising time TA required for reaching output of the light amount Pa1 of the white display among the multiple LD 21a-21c, to be earlier than the times (e.g., tb0 and tc0 of FIG. 8 and FIG. 10, tb3 and tc3 of FIG. 11, and tb1 and tc1 of FIG. 12) of applying to the other LD 21b and 21c the driving currents Ib1 and Id for outputting the lights of the light amounts Pb1 and Pc1 of the white display from the LD 21b and 21c. (Referring to the twenty-first configuration)

According to the twenty-first configuration, the time ta0 of applying to the LD 21a the driving current Ia1 for outputting the light of the light amount Pa1 of the white display from the LD 21a, which has the longest rising time TA required for reaching output of the light amount Pa1 of the white display among the multiple LD 21a-21c, is set earlier than the times (e.g., tb0 and tc0 of FIG. 8 and FIG. 10, tb3 and tc3 of FIG. 11, and tb1 and tc1 of FIG. 12) of applying to the other LD 21b and 21c the driving currents Ib1 and Ic1 for outputting the lights of the light amounts Pb1 and Pc1 of the white display from the LD 21b and 21c. Thus, the time ta1 when the LD 21a outputs the light of the light amount Pa1 of the white display can be close to the times tb1 and tc1 when the LD 21b and 21c output the lights of the light amounts Pb1 and Pc1 of the white display. Accordingly, the color unevenness, which results from the difference between the light emission delays of the LD 21a-21c when the LD 21a-21c perform the white display, can be improved.

Since the color unevenness of the scanning laser light 300 during the rising time TA of the LD 21a-21c having different colors is improved, deterioration of balance of the color of the scanning laser light 300 (e.g., white balance) can be suppressed as well.

Besides, in the light output controlling unit of the projector unit 101 of the first configuration, the light output controller 582 may set the time ta1 when the light amount of the LD 21a reaches the light amount Pa1 of the white display and the times tb1 and tc1 when the light amounts of the other LD 21b and 21c reach the light amounts Pb1 and Pc1 of the white display to be the same through light output control based on the respective time differences between the rising times TA, TB, and TC of the LD 21a-21c. (Referring to the twenty-second configuration)

According to the twenty-second configuration, light output control is performed such that the time ta1 when the LD 21a outputs the light of the light amount Pa1 of the white display and the times tb1 and tc1 when the LD 21b and 21c output the lights of the light amounts Pb1 and Pc1 of the white display become the same. Therefore, the color unevenness of the scanning laser light 300 outputted from the LD 21a-21c during the rising time TA can be further improved.

Alternatively, in the light output controlling unit of the projector unit 101 of the first configuration, the light output controller 582 may set a time when the light amount of the LD 21a reaches a predetermined percentage of the light amount Pa1 of the white display and a time when the light amounts of the LD 21b and 21c respectively reach the predetermined percentage of the light amounts Pb1 and Pa of the white display to be the same based on the respective time differences between the rising times TA, TB, and TC of the multiple LD 21a-21c. (Referring to the twenty-third configuration)

In addition, in the twenty-third configuration, the predetermined percentage may be 50%. (Referring to the twenty-fourth configuration)

According to the twenty-third and the twenty-fourth configurations, time-averaged color unevenness during the rising time TA of the LD 21a can be improved. Thus, deterioration of balance of the color of the scanning laser light 300 (e.g., white balance) outputted from the multiple LD 21a-21c can be suppressed as well.

Further, in the light output controlling unit of the projector unit 101 of anyone of the first to the fourth configurations, after applying to the LD 21b and 21c the driving currents of a first current value (e.g., 0.5Ib1 and 0.5Ic1) for enabling the LD 21b and 21c to output lights of light amounts (e.g., 0.5Pb1 and 0.5Pc1) less than the light amounts Pb1 and Pc1 of the white display, the light output controller 582 may apply to the LD 21b and 21c the driving currents of second current values Ib1 and Ic1 for enabling the LD 21b and 21c to output lights of the light amounts Pb1 and Pc1 of the white display. (Referring to the twenty-fifth configuration)

According to the twenty-fifth configuration, after performing light output of the light amounts (e.g., 0.5Pb1 and 0.5Pc1) less than the light amounts Pb1 and Pa of the white display, the LD 21b and 21c perform light output of the light amounts Pb1 and Pc1 of the white display. Accordingly, the changes of the light amounts of the LD 21b and 21c during the periods TB and TC from the start of light emission to the light output of the light amounts Pb1 and Pc1 of the white display can be close to the change of the light amount of the LD 21a during the rising time TA. Therefore, color unevenness and deterioration of balance of the color of the scanning laser light 300 outputted from the multiple LD 21a-21c can be further reduced.

Moreover, in the light output controlling unit of the projector unit 101 of anyone of the twenty-first to the twenty-fifth configurations, the light output controller 582 may increase the driving currents of the LD 21b and 21c in multiple stages up to the current values Ib1 and Ic1 that are for outputting the lights of the light amounts Pb1 and Pc1 of the white display from the LD 21b and 21c (refer to FIG. 11 and FIG. 12). (Referring to the twenty-sixth configuration)

According to the twenty-sixth configuration, the changes of the light amounts of the LD 21b and 21c during the periods TB and TC from the start of light emission to the light output of the light amounts Pb1 and Pc1 of the white display can be close to the change of the light amount of the LD 21a during the rising time TA. Accordingly, color unevenness and deterioration of balance of the color of the scanning laser light 300 outputted from the multiple LD 21a-21c can be further reduced.

In addition, the light output controlling unit of the projector unit 101 of anyone of the twenty-first to the twenty-sixth configurations may further include the calculating part 583 that calculates the rising times TA, TB, and TC of the multiple LD 21a-21c based on the detection result of the PD 23a-23c, which detect the light amounts of the multiple LD 21a-21c. (Referring to the twenty-seventh configuration)

According to the twenty-seventh configuration, the light amounts of the multiple LD 21a-21c can be properly detected, and the light output controller 582 can control the light outputs of the multiple LD 21a-21c by using the rising times TA, TB, and TC based on the detection result. Accordingly, even if the rising times TA, TB, and TC of the LD 21a-21c change due to change of the element temperature or degradation of the elements, for example, the light output controller 582 can perform light output control corresponding to such change.

Furthermore, in the light output controlling unit of the projector unit 101 of the twenty-seventh configuration, the light output controller 582 may control to output the scanning laser light 300, which is projected to and scans the projection surface 102a and forms the image on the projection surface 102a, from the multiple LD 21a-21c. When the scanning laser light 300 scans the invalid projection region 102c on the projection surface 102a where the image is not formed, the light output controller 582 may enable the multiple LD 21a-21c to emit lights and enable the calculating part 583 to calculate the rising times TA, TB, and TC based on the detection result of the PD 23a-23c when the scanning laser light 300 scans the invalid projection region 102c. (Referring to the twenty-eighth configuration)

According to the twenty-eighth configuration, when the scanning laser light 300 scans the invalid projection region 102c on the projection surface 102a, the light amounts of the multiple LD 21a-21c can be properly detected, and based on the result thereof, the rising times TA, TB, and TC of the LD 21a-21c can be calculated. Accordingly, by controlling the light output to be suitable for the actual states of the LD 21a-21c, color unevenness of the scanning laser light 300 can be improved and the quality of the image formed on the projection surface 102a can be enhanced.

Moreover, in the light output controlling unit of the projector unit 101 of anyone of the twenty-first to the twenty-eighth configurations, a memory (not shown) that stores the image information of the image forming by the light output of the multiple LD 21a-21c is further included, and the light output controller 582 may analyze the image information and control the light outputs of the multiple LD 21a-21c based on the result of the analysis. (Referring to the twenty-ninth configuration)

According to the twenty-ninth configuration, the light outputs of the LD 21a-21c can be controlled based on the result of analysis of the image information of the image formed on the projection surface 102a.

Fourth Embodiment

Next, the fourth embodiment is described. The fourth embodiment is different from the first embodiment in that the deficiency of the light amount of the scanning laser light 300a of the forward scan (i.e., the forward scanning laser light 300a), which results from the rise times TA, TB, and TC of the multiple LD 21a-21c, is supplemented by the light amount of the scanning laser light 300b the backward scan (i.e., the backward scanning laser light 300b). The configuration different from that of the first embodiment is described hereinafter. In addition, components the same as those of the first to third embodiments are assigned with the same reference numerals, and descriptions thereof are omitted.

Figure 13:
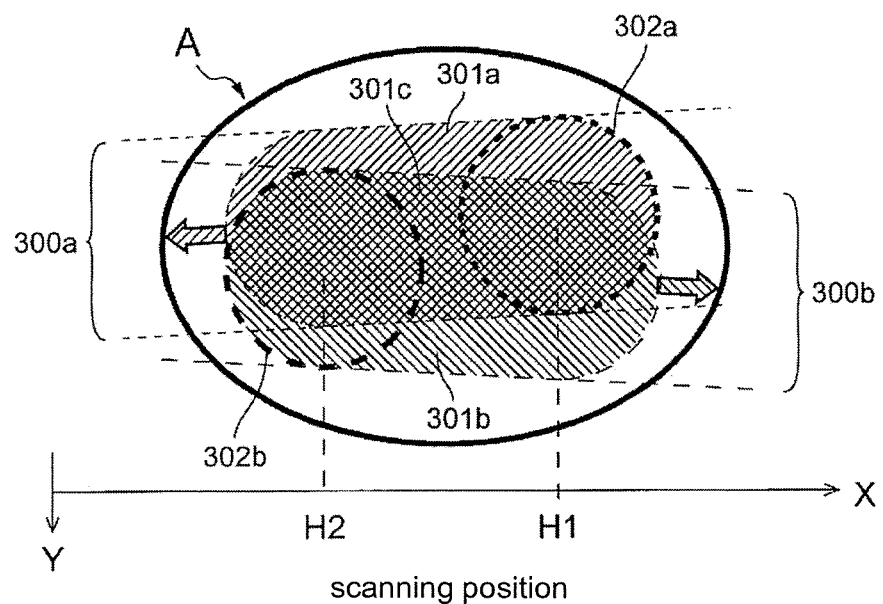
FIG. 13 is a schematic diagram partially showing the scanning range of the scanning light that scans continuously and reciprocally.

FIG. 13 is a schematic diagram partially illustrating a scanning range of the scanning laser light 300 which scans continuously and reciprocally. FIG. 13 depicts the range on the projection surface 102a surrounded by the solid line A in FIG. 5. As shown in FIG. 13, a scanning pitch (i.e., scanning interval) of each scanning laser light 300 in the Y direction is smaller than the spot diameter 302a of the forward scanning laser light 300a and the spot diameter 302b of the backward scanning laser light 300b. Therefore, the scanning laser light 300a and the scanning laser light 300b that scan continuously and reciprocally overlap each other partially.

The hatched parts of FIG. 13 respectively represent a scanning range 301a of the forward scanning laser light 300a and a scanning range 301b of the backward scanning laser light 300b, which overlap each other in an overlapping scanning range 301c. Furthermore, hereinafter a center position of each of the beam spots 302a and 302b of the scanning laser lights 300a and 300b in the X direction is referred to as a scanning position. A first scanning position H1 is the scanning position of the forward scanning laser light 300a at the light emission start time and is the scanning position of the backward scanning laser light 300b at the light emission end time. Moreover, a second scanning position H2 is the scanning position of the forward scanning laser light 300a at the light emission end time and is the scanning position of the backward scanning laser light 300b at the light emission start time.

Here, as described above, the multiple LD 21a-21c respectively have the rising times TA, TB, and TC when light emission starts. Therefore, the scanning laser light 300 has color unevenness from the scanning position where light emission occurs to a predetermined position where the rising time has passed. According to the invention, the decreasing light amounts in the region where the scanning laser lights 300a and 300b that scan continuously and reciprocally overlap partially (i.e., the overlapping scanning range 301c) supplement each other, so as to reduce or prevent such color unevenness. That is, the deficiency of the light amount of the forward scanning laser light 300a, which results from the rising times TA, TB, and TC of the multiple LD 21a-21c, is supplemented by the light amount of the backward scanning laser light 300b. Similarly, the deficiency of the light amount of the forward scanning laser light 300a, which results from the rising times TA, TB, and TC of the multiple LD 21a-21c, is supplemented by the light amount of the backward scanning laser light 300b.

The principle of compensating for the deficiency of the light amount of the scanning laser light 300a by averaging the light amounts is explained below. For ease of understanding of the principle, the description is mainly based on the light output control of the red component (i.e., the red LD 21a) of the scanning laser light 300. Nevertheless, the light outputs of the other color components (i.e., the green LD 21b and the blue LD 21c) of the scanning laser light 300 are also controlled in the same manner.

Figure 14:
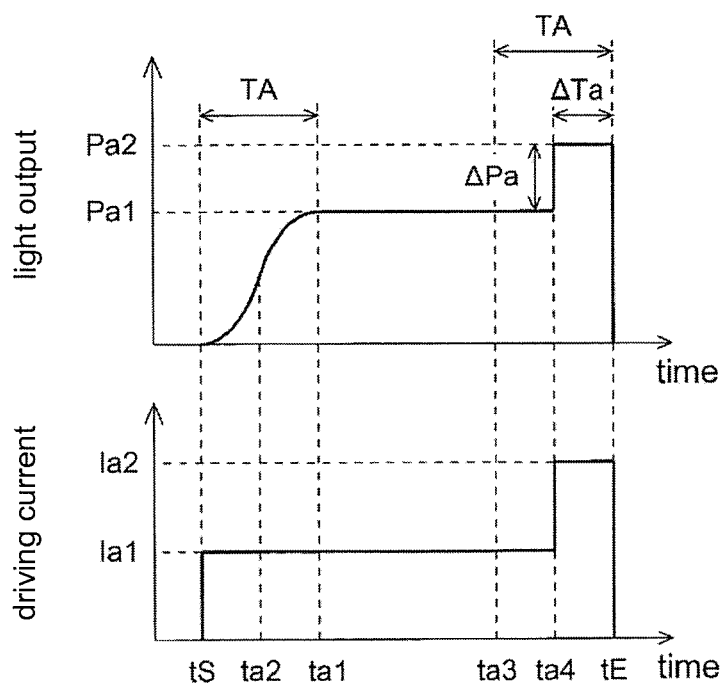
FIG. 14 is a graph showing an example of the light output control of the red LD according to the fourth embodiment.

First, the light outputs of the forward and backward scanning laser lights 300a and 300b are controlled in the same manner between the first scanning position H1 and the second scanning position H2. FIG. 14 is a graph showing an example of the light output control of the red LD 21a according to the first embodiment. FIG. 14 illustrates the light output control of the red LD 21a from the start to the end of light emission of the forward and backward scanning laser lights 300a and 300b.

In FIG. 14, the time tS is the time when the projection of the red component (i.e., light emission of the LD 21a) of the scanning laser light 300, which is for forming the projection image based on the image information on the projection surface 102a, is started. The time tS corresponds to the time when the center position of the beam spot 302a of the forward scanning laser light 300a in the X direction is at the first scanning position H1 and corresponds to the time when the center position of the beam spot 302b of the backward scanning laser light 300b in the X direction is at the second scanning position H2. In addition, the time tE is the time when the light emission of the LD 21a ends. The time tE corresponds to the time when the center position of the forward beam spot 302a in the X direction is at the second scanning position H2 and corresponds to the time when the center position of the backward beam spot 302b in the X direction is at the first scanning position H1.

Moreover, the time ta1 is the time when the rising time TA has passed after the time tS, and is the time when the light output of the LD 21a reaches the constant light amount Pa1 corresponding to the fixed driving current Ia1. The time ta3 is earlier than the time tE by a time that is equal to the rising time TA. The time ta4 is earlier than the time tE by the light supplement time $\Delta Ta$, and is the time when the LD 21a outputs a light of the light amount Pa2 that is greater than the light amount Pa1 by the correction light amount $\Delta Pa$. The LD 21a is applied with a driving current having the current value Ia1 during the times tS-ta4 and applied with a driving current having the current value Ia2 during the times ta4-tE. In FIG. 14, the light supplement time $\Delta Ta$ is set to 0.5×TA, for example, and the correction light amount $\Delta Pa$ is set to 0.5×Pa1, for example. However, they are not limited to the values exemplified above, and may be set to other values as long as the light supplement time $\Delta Ta$ is equal to or shorter than the rising time TA ($0<\Delta Ta \leq TA$) and the light amount Pa2 is equal to or less than twice the light amount Pa1 (i.e., $0<\Delta Pa \leq Pa1$ when $\Delta PA=Pa2-Pa1$).

Described below is the appearance of the light amount of the scanning laser light 300 between the first scanning position H1 and the second scanning position H2 felt by the person who looks at the projection surface 102a in the case that the light output control is performed as shown in FIG. 14. Hereinafter, the appearance of the light amount of the red component of the scanning laser light 300 is described in the same manner as FIG. 6. Needless to say, the appearances of the light amounts of the other color components (i.e., the green component and blue component) may be felt in the same way.

Figure 15A:
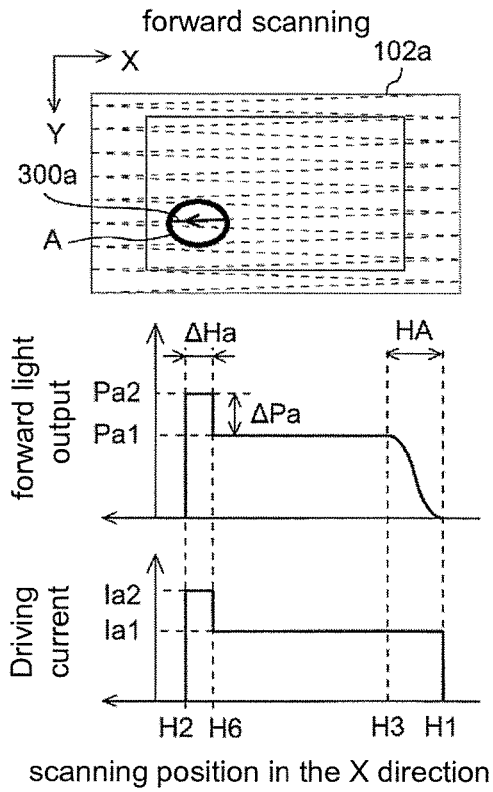
FIG. 15A is a diagram showing a change of the light output of the forward scanning light that scans from the first scanning position to the second scanning position according to the fourth embodiment.
Figure 15B:
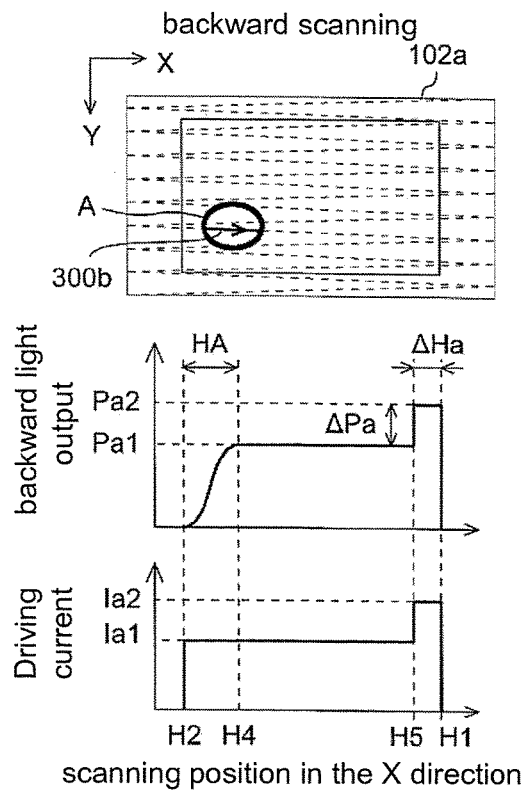
FIG. 15B is a diagram showing a change of the light output of the backward scanning light that scans from the second scanning position to the first scanning position according to the fourth embodiment.
Figure 15C:
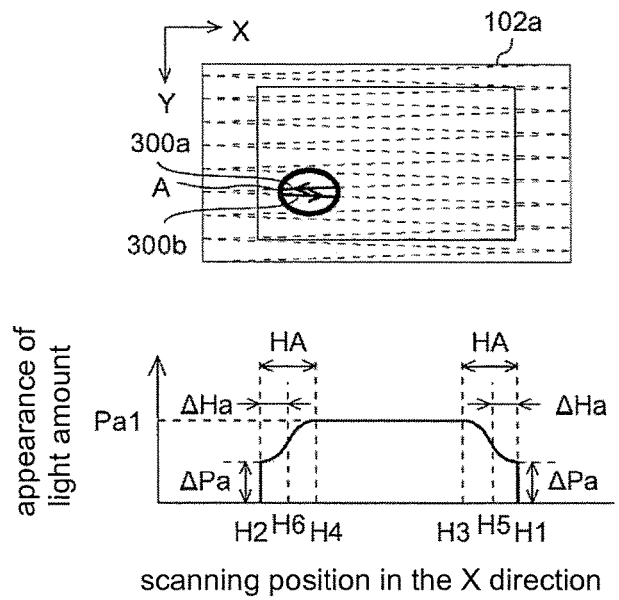
FIG. 15C is a diagram showing a change of the appearance of the light amount of the scanning light between the first scanning position and the second scanning position according to the fourth embodiment.

FIG. 15A to FIG. 15C are diagrams for illustrating the appearance of the light amount of the scanning laser light 300 between the first scanning position H1 and the second scanning position H2 according to the first embodiment. FIG. 15A is a diagram showing a change of the light output of the forward scanning laser light 300a that scans from the first scanning position H1 to the second scanning position H2 according to the fourth embodiment. FIG. 15B is a diagram showing a change of the light output of the backward scanning laser light 300b that scans from the second scanning position H2 to the first scanning position H1 according to the fourth embodiment. FIG. 15C is a diagram showing a change of the appearance of the light amount of the scanning laser light 300 between the first scanning position H1 and the second scanning position H2 according to the fourth embodiment.

It should be noted that the horizontal axis of the graphs in FIG. 15A to FIG. 15C indicates the scanning position of the scanning laser light 300, which is different from FIG. 14. Therefore, the graph shapes of the light output and driving current and the direction of the horizontal axis of FIG. 15A related to the forward scanning laser light 300a are reverse to those of FIG. 15B related to the backward scanning laser light 300b. Moreover, the graphs of FIG. 15A, FIG. 15B, and FIG. 15C represent the appearance of the light amount in the overlapping scanning range 301c (refer to FIG. 13) between the first scanning position H1 and the second scanning position H2, felt by the person when the aforementioned effect of averaging the light amounts is applied.

A scanning position H3 indicates the scanning position of the forward scanning laser light 300a when the rising time TA has passed after light emission starts at the first scanning position H1. Further, a scanning position H6 indicates the scanning position of the forward scanning laser light 300a at a time that is earlier than the end of light emission at the second scanning position H2 by the light supplement time $\Delta Ta$. Regarding the forward scanning laser light 300a, a range between the scanning positions H1 and H3 corresponds to a scanning range HA of the rising time TA (referred to as "rising scanning range HA" hereinafter), and a range between the scanning positions H2 and H6 corresponds to a scanning range of the light supplement time $\Delta Ta$ before the light emission ends (referred to as "light supplement scanning range $\Delta Ha$" hereinafter).

Moreover, a scanning position H4 indicates the scanning position of the backward scanning laser light 300b when the rising time TA has passed after light emission starts at the second scanning position H2. Further, a scanning position H5 indicates the scanning position of the backward scanning laser light 300b at a time that is earlier than the end of light emission at the first scanning position H1 by the light supplement time $\Delta Ta$. Regarding the backward scanning laser light 300b, a range between the scanning positions H2 and H4 corresponds to the rising scanning range HA, and a range between the scanning positions H1 and H5 corresponds to the light supplement scanning range $\Delta Ha$.

Regarding the forward and backward scanning laser lights 300a and 300b, the light amount Pa2 during the light supplement scanning range $\Delta Ha$ is greater than the light amount Pa1 that corresponds to the driving current Ia1 by the correction light amount $\Delta Pa$. In addition, a distance between the scanning positions H1 and H3 of the forward scanning laser light 300a and a distance between the scanning positions H2 and H4 of the backward scanning laser light 300b are both HA. Further, a distance between the scanning positions H2 and H6 of the forward scanning laser light 300a and a distance between the scanning positions H1 and H5 of the backward scanning laser light 300b in the X direction are both $\Delta Ha$. As described above, since $0<\Delta Ta \leq TA$, the distance $\Delta Ha$ is set equal to or shorter than the distance HA ($0<\Delta Ha \leq HA$).

When the forward and backward scanning laser lights 300a and 300b scan, the light amount between the scanning positions H1 and H2 visually felt by the person is as depicted by the graph of FIG. 15C. That is, the deficiency of the light amount in the rising scanning range HA (between the scanning positions H1 and H3) of the forward scanning laser light 300a is supplemented by the correction light amount $\Delta Pa$ of the light supplement scanning range $\Delta Ha$ (between the scanning positions H1 and H5) of the backward scanning laser light 300b. Moreover, the deficiency of the light amount in the rising scanning range HA (between the scanning positions H2 and H4) of the backward scanning laser light 300b is supplemented by the correction light amount $\Delta Pa$ of the light supplement scanning range $\Delta Ha$ (between the scanning positions H2 and H6) of the forward scanning laser light 300a. Accordingly, the light amounts visually felt by the person between the scanning positions H1 and H3 and between the scanning positions H2 and H4 can be close to the constant light amount Pa1. Therefore, the reduction in light amount resulting from the light emission delay at the start of light emission of the LD 21*a* is improved.

Figure 16:
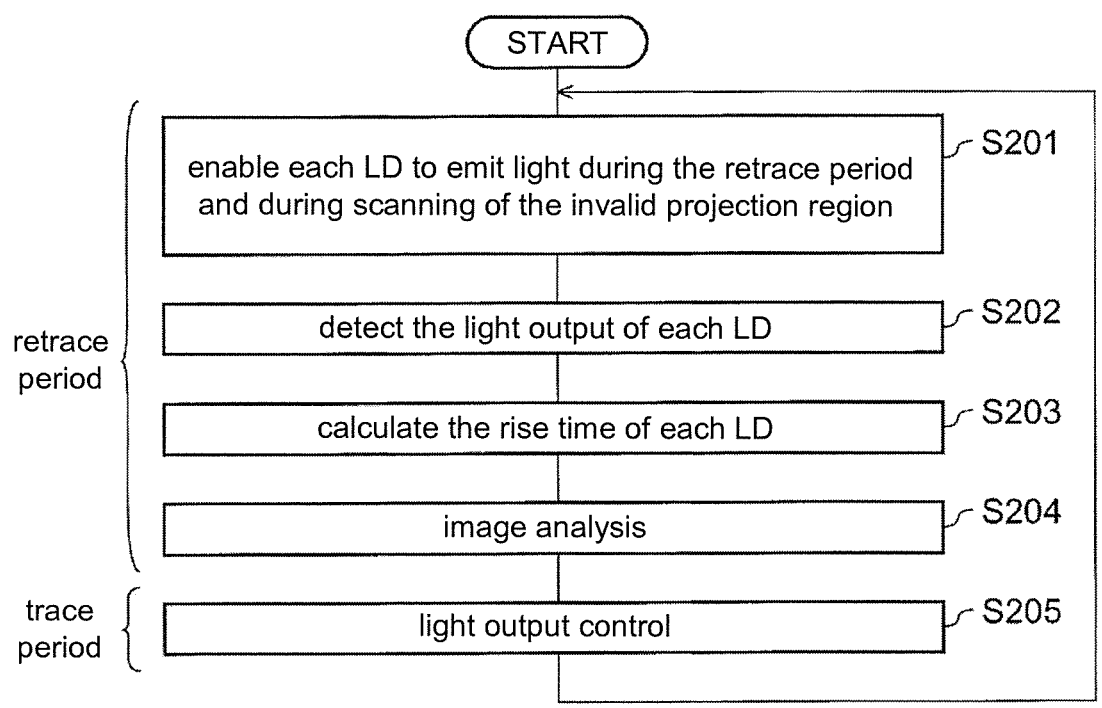
FIG. 16 is a flowchart for explaining an example of the light output control process of the LD.

Next, a light output control process for the LD 21*a*-21*c* is described. FIG. 16 is a flowchart for explaining an example of the light output control process of the LD 21*a*-21*c*. In the process described below, S201-S204 are performed in the retrace period and S205 is performed in the trace period. In addition, the processes of the light output control illustrated in FIG. 16 can be also applicable to the fifth and the sixth embodiments.

First, in the retrace period, when the optical axis of the scanning laser light 300 scans the invalid projection region 102*c*, the light output controller 582 enables the LD 21*a*-21*c* to emit light at the predetermined light amounts (e.g., Pa1, Pb1, and Pc1) by applying the driving currents Ia1-Ic1 (S201). The times of applying the driving currents Ia1-Ic1 are longer than the rising times TA, TB, and TC of the LD 21*a*-21*c* respectively. Light outputs of the LD 21*a*-21*c* are detected by the PD 23*a*-23*c* respectively (S202). The calculating part 583 calculates the rising times TA, TB, and TC of the LD 21*a*-21*c*, based on the detection results of the PD 23*a*-23*c* (S203). Further, the light output controller 582 imports the image data outputted from the image processor 581 into a memory (not shown) and performs an image analysis on the projection image projected to the projection surface 102*a* in the trace period based on the image data (S204). That is, the color information, brightness information, and so on of the projection image formed in the trace period are analyzed.

Thereafter, in the trace period, the light output controller 582 performs light output control over the multiple LD 21*a*-21*c* based on the result of the image analysis, the calculation result of the calculator 583, the light output correction information of the multiple LD 21*a*-21*c* read from the storage part 57, and so on (S105). In addition, the light output correction information is stored in the storage part 57 and is information for storing data (e.g., light supplement time ΔTa, correction light amount ΔPa, and so on, which will be described later) that is to be used for compensating for the insufficient light amount during the rising times TA, TB, and TC of the multiple LD 21*a*-21*c*.

Figure 17:
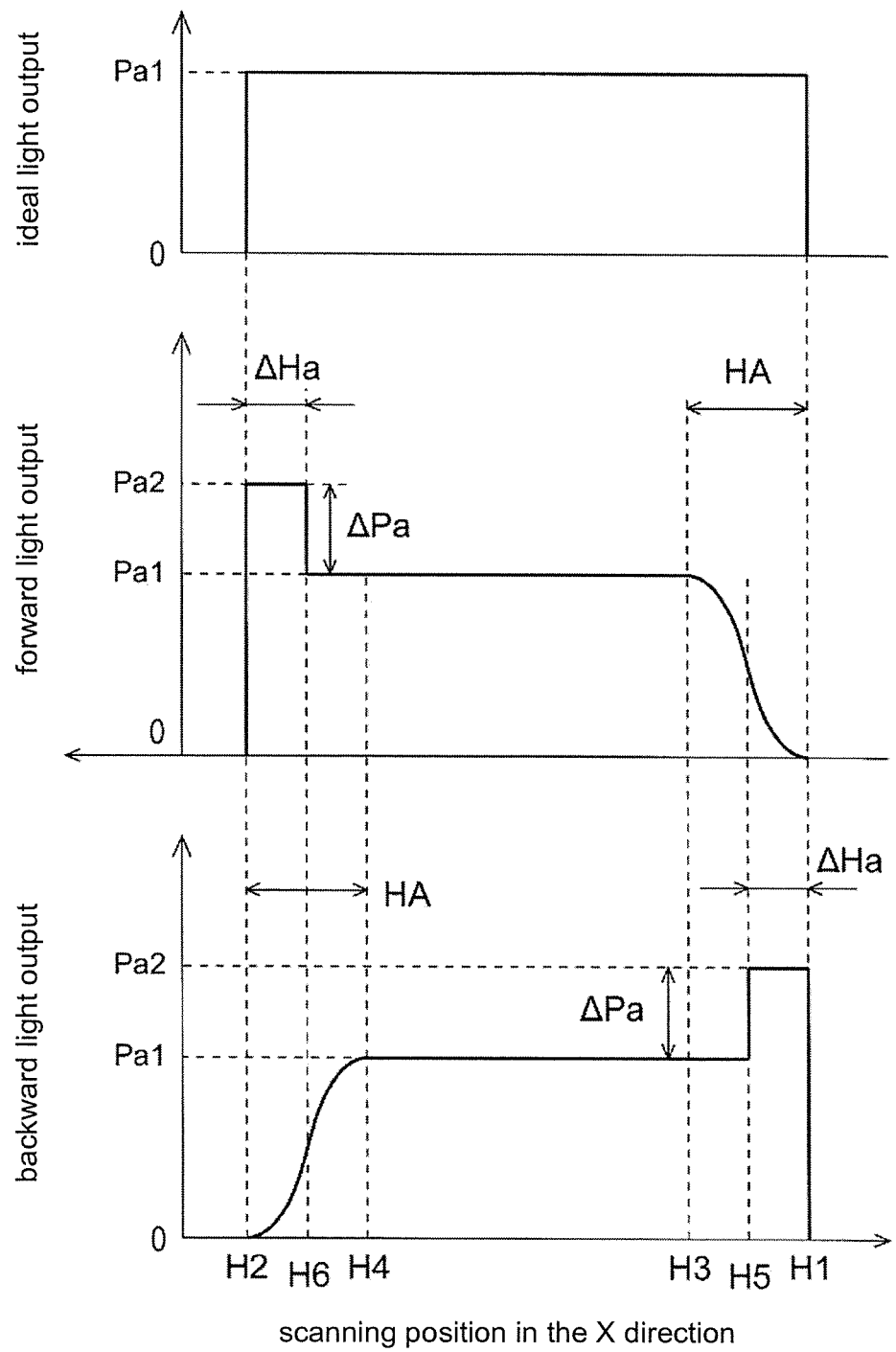
FIG. 17 is a diagram showing a change of the ideal light output of the LD in the case of performing light output of the constant light amount, and changes of the actual light outputs of the forward and backward scanning laser lights.

The above illustrates a case of achieving ideal light outputs having the constant light amounts Pa1, Pb1, and Pc1 by averaging the light outputs of the forward and backward scanning laser lights 300*a* and 300*b* in the overlapping scanning range 301*c* (refer to FIG. 13). FIG. 17 is a diagram showing a change of the ideal light output of the LD 21*a* in the case of performing light output of the constant light amount Pa1, and changes of the actual light outputs of the forward and backward scanning laser lights 300*a* and 300*b*. FIG. 17 illustrates the change of the light output of the scanning laser light 300 of the LD 21*a*. Since the cases of the LD 21*b* and LD 21*c* are similar, descriptions thereof are omitted. Moreover, the upper graph of FIG. 9 illustrates the change in light amount of the ideal light output, the middle graph illustrates the change of the actual light output of the forward scanning laser light 300*a* that scans from the first scanning position H1 to the second scanning position H2, and the lower graph illustrates the change of the actual light output of the backward scanning laser light 300*b* that scans from the second scanning position H2 to the first scanning position H1.

As shown in the upper graph of FIG. 17, the rise of the ideal light output is steep in both the first and second scanning positions H1 and H2. In the case of performing such light output, it is required to rapidly increase the rise of the actual light output when the light emission starts and rapidly decrease the fall when the light emission ends at the first and second scanning positions H1 and H2. That is, when the light emission starts, the driving current of the oscillation threshold current Is or more (refer to FIG. 24) is supplied to the LD 21*a* to rapidly increase the scanning laser light 300 to the light amount Pa1. Further, when the light emission ends, the driving current supplied to the LD 21*a* is decreased from the current value that is equal to or more than the oscillation threshold current Is to a current value less than the oscillation threshold current Is, so as to rapidly decrease the scanning laser light 300 from the light amount Pa1.

However, as the light amount is rapidly increased when the light emission starts, a reduction in the light amount resulting from the light emission delay (so-called "rising delay") occurs. Thus, the light amount of the light output in the rising scanning range HA (between the scanning positions H1 and H3) of the forward scanning laser light 300*a* is insufficient, as shown in the middle graph of FIG. 9, and is less than the light amount Pa1. Likewise, the light amount in the rising scanning range HA (between the scanning positions H2 and H4) of the backward scanning laser light 300*b* is also insufficient, as shown in the lower graph of FIG. 9, and is less than the light amount Pa1. Accordingly, the light output is performed with the light amount Pa2=(Pa1+ΔPa) in the light supplement scanning range ΔHa (between the scanning positions H2 and H6) of the forward scanning laser light 300*a*, and the light output is performed with the light amount Pa2 in the light supplement scanning range ΔHa (between the scanning positions H1 and H5) of the backward scanning laser light 300*b*. By performing such light outputs, the deficiency of the light amount in the rise scanning range HA (between the scanning positions H1 and H3) of the forward scanning laser light 300*a* is averaged and supplemented by the correction light amount ΔPa of the backward scanning laser light 300*b*. Further, the deficiency of the light amount in the rise scanning range HA (between the scanning positions H2 and H4) of the backward scanning laser light 300*b* is averaged and supplemented by the correction light amount ΔPa of the forward scanning laser light 300*a*. Accordingly, the ideal light output as shown in the upper graph of FIG. 9 is achieved by averaging the light outputs of the forward and backward scanning laser lights 300*a* and 300*b* in the overlapping scanning range 301*c* (refer to FIG. 13).

Nevertheless, if the rise of the ideal light output at at least one of the first and second scanning positions H1 and H2 has a gentle slope to an extent that does not cause the light emission delay in the actual light output, which is different from the example of FIG. 17, the actual scanning laser light 300 that starts light emission at the aforesaid scanning position does not have the light emission delay. Accordingly, the fall (decrease of the light amount) when the light emission ends at the aforesaid scanning position can have the same gentle slope. These cases are explained below.

Modified Example of the Fourth Embodiment

Figure 18:
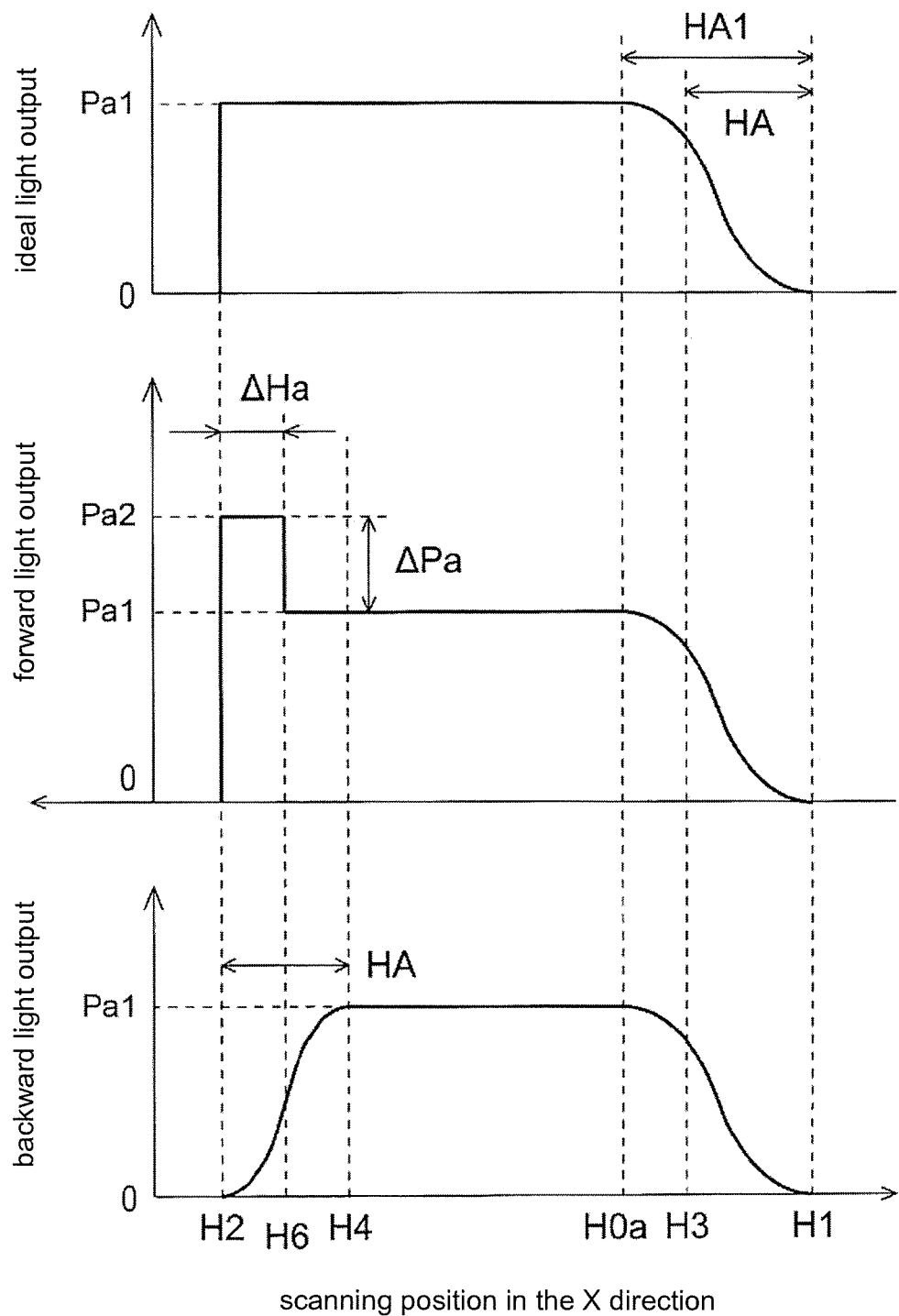
FIG. 18 is a diagram showing a change of the ideal light output of the LD in the case of raising the light output gently in the rise scanning range on the side of the first scanning position, and changes of the actual forward and backward light outputs.

First, a case where the rise of the ideal light output has a gentle slope on the side of the first scanning position H1 is described. FIG. 18 is a diagram showing a change of the ideal light output of the LD 21*a* in the case of raising the light output gently in a rising scanning range HA1 (between the scanning positions H1 and H0*a*) on the side of the first scanning position H1, and changes of the actual forward and backward light outputs. FIG. 18 illustrates the change in light amount of the light output of the LD 21*a* with respect to the scanning position of the scanning laser light 300 on the projection surface 102a in the scanning direction. Since the cases of the LD 21b and LD 21c are similar, descriptions thereof are omitted. Moreover, the upper graph of FIG. 18 illustrates the change in light amount of the ideal light output, the middle graph illustrates the change of the actual light output of the forward scanning laser light 300a that scans from the first scanning position to the second scanning position, and the lower graph illustrates the change of the actual light output of the backward scanning laser light 300b that scans from the second scanning position to the first scanning position.

As shown in the upper graph of FIG. 18, the rise of the ideal light output on the side of the first scanning position H1 changes gently in the rising scanning range HA1. (between the scanning positions H1 and H0a) where the light amount thereof reaches the constant light amount Pa1 from 0. That is, a width (scanning distance) of the rising scanning range HA1 is wider than a width of the rise scanning range HA in the case where the actual scanning laser light 300 has the light emission delay. In other words, on the side of the first scanning position H1, the rise of the ideal light output is later than the rising time TA due to the light emission delay of the actual light output. In such a case, the rise of the forward scanning laser light 300a (the change of the light output between the scanning positions H1 and H0a) does not have the light emission delay and consequently the deficiency of the light amount caused by the delay does not occur. Therefore, the light output of the forward scanning laser light 300a when the light emission starts changes gently to the same extent as the ideal light output. In addition, the light output of the backward scanning laser light 300b between the scanning positions H1 and H0a before the light emission ends also changes gently as the ideal light output.

On the other hand, in FIG. 18, the rise of the ideal light output at the second scanning position H2 increases rapidly in the same way as FIG. 9. In such a case, the fall of the forward scanning laser light 300a is decreased rapidly. Moreover, although the rise of the backward scanning laser light 300b is rapidly increased, reduction in the light amount that results from the light emission delay (so-called "rising delay") occurs. Therefore, the light amount in the rising scanning range HA (between the scanning positions H2 and H4) of the backward scanning laser light 300b is insufficient, as shown in the lower graph of FIG. 10, and is less than the light amount Pa1. Accordingly, the light output is performed with the light amount Pa2=(Pa1+ΔPa) in the light supplement scanning range ΔHa (between the scanning positions H2 and H6) right before the end of the light emission of the forward scanning laser light 300a, by which the deficiency of the light amount in the rising scanning range HA (between the scanning positions H2 and H4) of the backward scanning laser light 300b is supplemented by the correction light amount ΔPa of the forward scanning laser light 300a. That is, the ideal light output at the second scanning position H2 as shown in the upper graph of FIG. 10 is achieved by averaging the light output in the scanning positions H2-H4 right before the end of the light emission of the forward scanning laser light 300a and the light output in the scanning positions H2-H4 right after the start of the light emission of the backward scanning laser light 300b in the overlapping scanning range 301c (refer to FIG. 13).

Another Modified Example of the Fourth Embodiment

Figure 19:
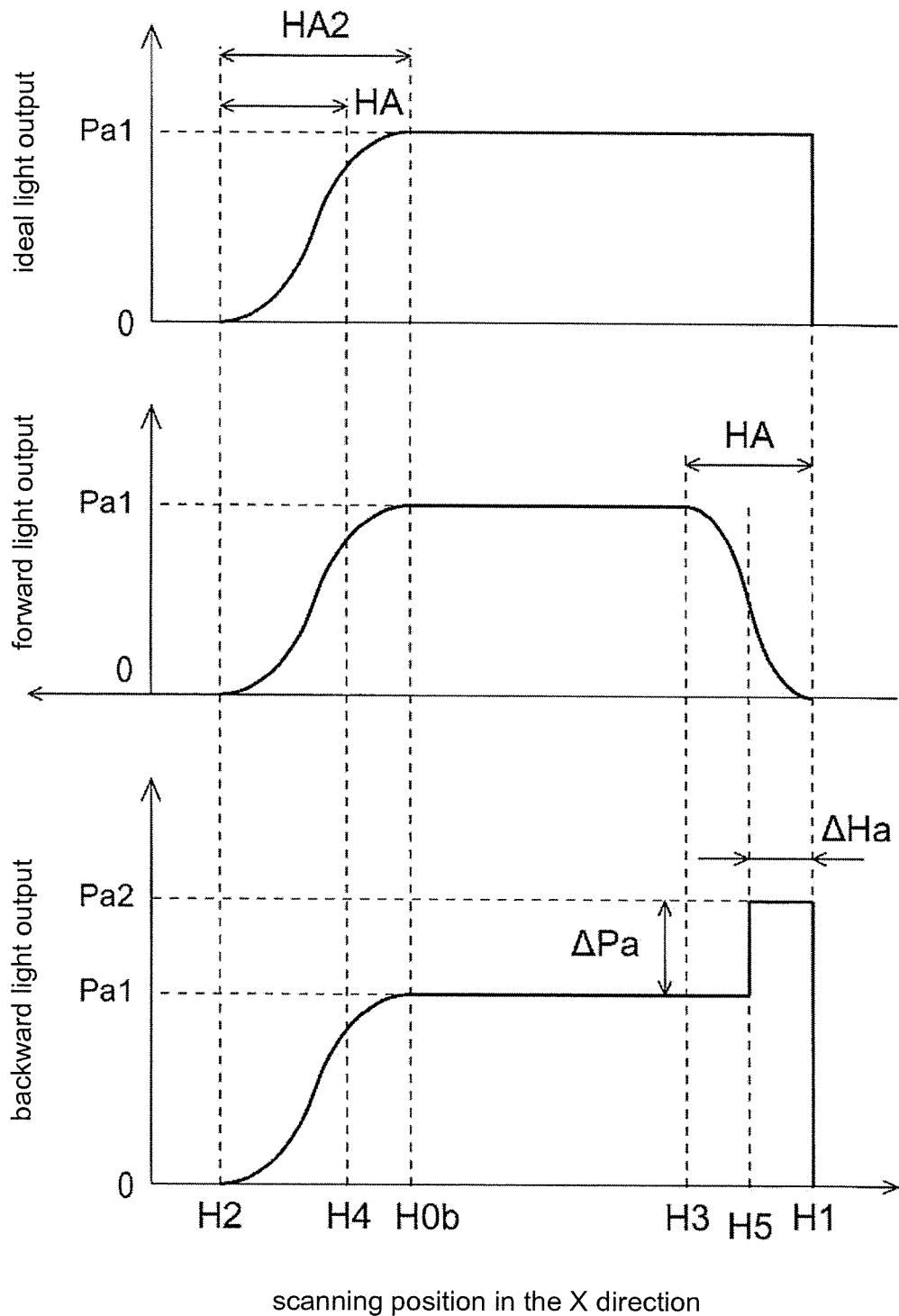
FIG. 19 is a diagram showing a change of the ideal light output of the LD in the case of raising the light output gently in the rise scanning range on the side of the second scanning position, and changes of the actual forward and backward light outputs.

Next, a case where the rise of the ideal light output has a gentle slope on the side of the second scanning position H2 is described. FIG. 19 is a diagram showing a change of the ideal light output of the LD 21a in the case of raising the light output gently in a rising scanning range HA2 (between the scanning positions H2 and H0b) on the side of the second scanning position H2, and changes of the actual forward and backward light outputs. FIG. 19 illustrates the change in light amount of the light output of the LD 21a with respect to the scanning position of the scanning laser light 300 on the projection surface 102a in the scanning direction. Since the cases of the LD 21b and LD 21c are similar, descriptions thereof are omitted. Moreover, the upper graph of FIG. 19 illustrates the change in light amount of the ideal light output, the middle graph illustrates the change of the actual light output of the forward scanning laser light 300a that scans from the first scanning position to the second scanning position, and the lower graph illustrates the change of the actual light output of the backward scanning laser light 300b that scans from the second scanning position to the first scanning position.

As shown in the upper graph of FIG. 19, the rise of the ideal light output at the first scanning position H1 increases rapidly like FIG. 17. In such a case, although the rise of the forward scanning laser light 300a is rapidly increased, reduction in the light amount that results from the light emission delay (so-called "rising delay") occurs. Thus, the light amount in the rising scanning range HA (between the scanning positions H1 and H3) of the forward scanning laser light 300a is insufficient, as shown in the middle graph of FIG. 11, and is less than the light amount Pa1. Accordingly, the light output is performed with the light amount Pa2=(Pa1+ΔPa) in the light supplement scanning range ΔHa (between the scanning positions H1 and H5) right before the end of the light emission of the backward scanning laser light 300b, by which the deficiency of the light amount in the rising scanning range HA (between the scanning positions H1 and H3) of the forward scanning laser light 300a is supplemented by the correction light amount ΔPa of the backward scanning laser light 300b. That is, the ideal light output at the first scanning position H1 as shown in the upper graph of FIG. 11 is achieved by averaging the light output in the scanning positions H1-H3 right after the start of the light emission of the forward scanning laser light 300a and the light output in the scanning positions H1-H3 right before the end of the light emission of the backward scanning laser light 300b in the overlapping scanning range 301c (refer to FIG. 13).

On the other hand, in FIG. 19, the rise of the ideal light output on the side of the second scanning position H2 changes gently in the rising scanning range HA2 (between the scanning positions H2 and H0b) where the light amount thereof reaches the fixed light amount Pa1 in the laser oscillation mode from 0. That is, a width (scanning distance) of the rising scanning range HA2 is wider than the width of the rising scanning range HA in the case where the actual scanning laser light 300 has the light emission delay. In other words, on the side of the second scanning position H2, the rise of the ideal light output is later than the rising time TA due to the light emission delay of the actual light output. In the case of performing such light output, the rise of the backward scanning laser light 300b (the change of the light output between the scanning positions H2 and H0b) does not have the light emission delay and consequently the deficiency of the light amount caused by the delay does not occur. Therefore, the light output of the backward scanning laser light 300b when the light emission starts changes gently to the same extent as the ideal light output. In addition, the light output of the forward scanning laser light 300a between the scanning positions H2 and H0b before the light emission ends also changes gently as the ideal light output.

In the case where the rises of the ideal light output on both the sides of the first and second scanning positions H1 and H2 have gentle slopes, the actual light output does not have the light emission delay when the light emission starts. Thus, the changes of the light outputs of the forward and backward scanning laser lights 300a and 300b are the same as the change of the ideal light output.

Fifth Embodiment

The fifth embodiment is described hereinafter. In the fifth embodiment, the correction light amount ΔPa and the light supplement time ΔTa are determined according to a cumulative amount S1 of the deficiency of the light amount in the rising times TA, TB, and TC of the LD 21a-21b. Otherwise, the fifth embodiment is the same as the second embodiment. The configuration different from that of the first embodiment is described hereinafter. In addition, components the same as those of the first embodiment are assigned with the same reference numerals, and descriptions thereof are omitted.

Figure 20:
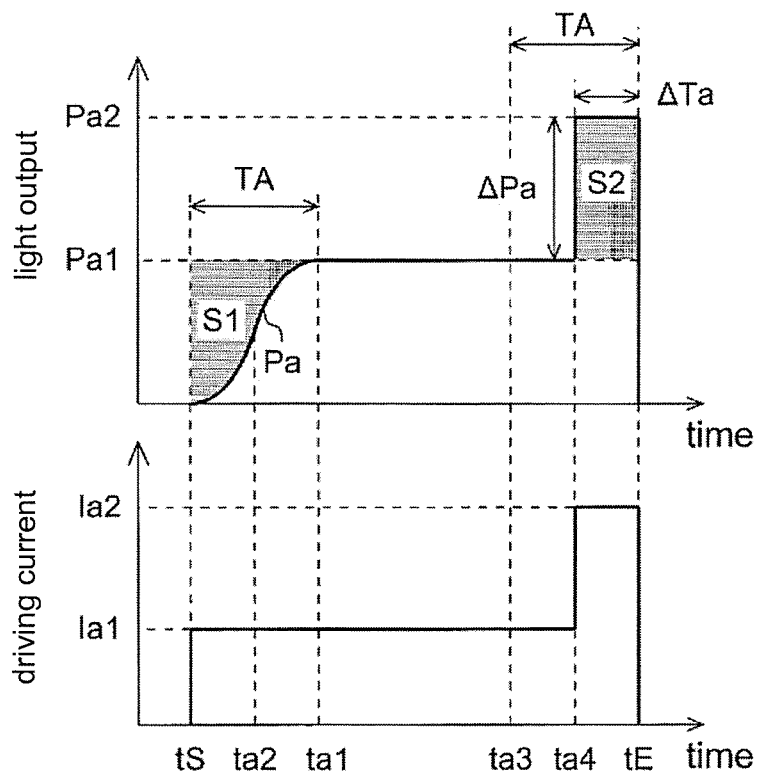
FIG. 20 is a graph showing an example of the light output control of the red LD according to the fifth embodiment.

FIG. 20 is a graph showing an example of the light output control of the red LD 21a according to the fifth embodiment. The light output control of the LD 21a is described below as an example. Nevertheless, the other LD 21b and 21c can be controlled in the same manner.

FIG. 20 illustrates the light output control of the red LD 21a from the start to the end of light emission of the forward and backward scanning laser lights 300a and 300b. In FIG. 20, the deficiency amount S1 is the cumulative amount of the deficiency (reduction) of the light amount caused by the light emission delay in the rising time TA. That is, the deficiency amount S1 is a time integration amount of a light amount difference (Pa1−Pa) between the constant light amount Pa1 corresponding to the driving current Ia1 and the actual light amount Pa in the rising time TA. Moreover, a correction amount S2 is a cumulative light amount obtained by time-integrating the correction light amount ΔPa in the light supplement time ΔTa.

As shown in FIG. 20, the light output of the LD 21a is controlled such that the correction amount S2 is the same as the deficiency amount S1. In other words, the correction light amount ΔPa and the light supplement time ΔTa are set so as to satisfy S1=S2=ΔPa×ΔTa. However, the setting method thereof is not particularly limited. For example, the correction light amount ΔPa and the light supplement time ΔTa may be set within a range that satisfies this condition. Alternatively, one of the correction light amount ΔPa and the light supplement time ΔTa may be a fixed value while the other may be determined as appropriate based on the aforementioned condition.

Described below is the appearance of the light amount of the scanning laser light 300 between the first scanning position H1 and the second scanning position H2 felt by the person who looks at the projection surface 102a in the case where the light output control is performed as shown in FIG. 20. Hereinafter, the appearance of the light amount of the red component of the scanning laser light 300 is described in the same manner as FIG. 20. Needless to say, the appearances of the light amounts of the other color components (i.e., the green component and blue component) may be felt in the same way.

FIG. 21A to FIG. 21C are diagrams for illustrating the appearance of the light amount of the scanning laser light 300 between the first scanning position H1 and the second scanning position H2 according to the fifth embodiment. FIG. 21A is a diagram showing a change of the light output of the forward scanning laser light 300a that scans from the first scanning position H1 to the second scanning position H2 according to the fifth embodiment. FIG. 21B is a diagram showing a change of the light output of the backward scanning laser light 300b that scans from the second scanning position H2 to the first scanning position H1 according to the fifth embodiment. FIG. 21C is a diagram showing a change of the appearance of the light amount of the scanning laser light 300 between the first scanning position H1 and the second scanning position H2 according to the fifth embodiment.

It should be noted that the horizontal axis of the graphs in FIG. 21A to FIG. 21C indicates the position of the scanning laser light 300 in the X direction, which is different from FIG. 20. Therefore, the graph shapes of the light output and driving current and the direction of the horizontal axis of FIG. 21A related to the forward scanning laser light 300a are reverse to those of FIG. 21B related to the backward scanning laser light 300b. Moreover, the graph of FIG. 13C represents the appearance of the light amount in the overlapping scanning range 301c (refer to FIG. 5) between the first scanning position H1 and the second scanning position H2, felt by the person due to the average effect of the light amounts.

In FIG. 21A and FIG. 21B, a deficiency amount s1 is an integration amount of the deficiency of the light amount caused by the light emission delay with respect to a scanning distance HA in the rising time TA, and corresponds to the deficiency amount S1 of FIG. 20. In addition, a correction amount s2 is an integration amount of the correction light amount ΔPa with respect to a scanning distance ΔHa in the light supplement time ΔTa, and corresponds to the correction amount S2 of FIG. 20.

When the forward and backward scanning laser lights 300a and 300b scan, the light amount between the scanning positions H1 and H2 visually felt by the person is as depicted by the graph of FIG. 21C. That is, the deficiency amount s1 in the rising scanning range HA (i.e., between the scanning positions H1 and H3) of the forward scanning laser light 300a is supplemented by the correction amount s2 in the light supplement scanning range ΔHa (i.e., between the scanning positions H1 and H5) of the backward scanning laser light 300b. Further, the deficiency amount s1 in the rising scanning range HA (i.e., between the scanning positions H2 and H4) of the backward scanning laser light 300b is supplemented by the correction amount s2 in the light supplement scanning range ΔHa (i.e., between the scanning positions H2 and H6) of the forward scanning laser light 300a. Accordingly, the light amounts visually felt by the person between the scanning positions H1 and H3 and between the scanning positions H2 and H4 can be close to the constant light amount Pa1. Therefore, the reduction in light amount resulting from the light emission delay at the start of light emission of the LD 21a is improved.

In the above example, the LD 21a is controlled to make the deficiency amount S1 of FIG. 20 the same as the correction amount S2. However, the invention is not limited to this example. The LD 21a may also be controlled to make the deficiency amount s1 of FIG. 21A to FIG. 21C the same as the correction amount s2. Additionally, the light outputs of the green LD 21b and the blue LD 21c may be controlled in the same manner as described above. Accordingly, by performing the light output control described above, the color unevenness, which results from the light emission delay of each of the LD 21a-21c in the edge portion of the overlapping scanning range 301c where the forward and backward scanning laser lights 300a and 300b overlap in the X direction, i.e., the scanning range between the scanning positions H1 and H3 and the scanning range between the scanning positions H2 and H5, is reduced or prevented.

Sixth Embodiment

Figure 22:
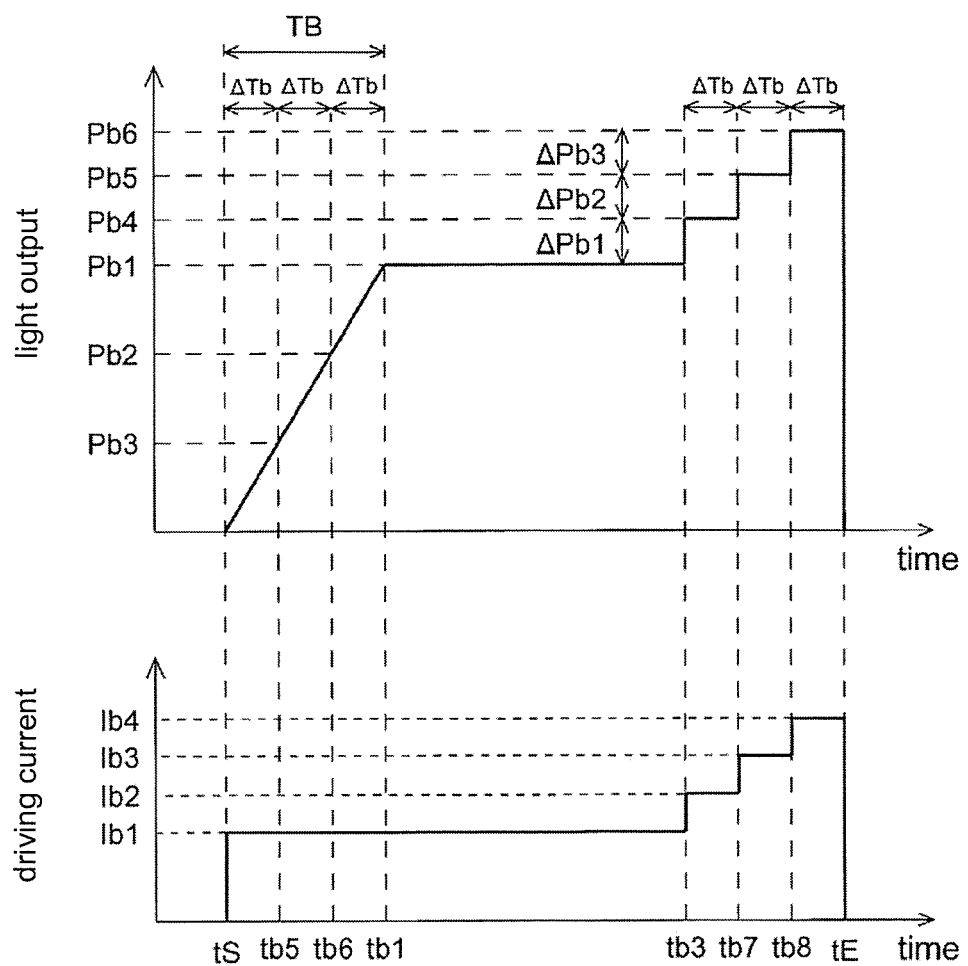
FIG. 22 is a graph showing an example of the light output control of the green LD according to the sixth embodiment.

The sixth embodiment is described hereinafter. The green LD 21b is described as an example in the sixth embodiment. Nevertheless, the description below also applies to the other LD 21a and 21c. FIG. 22 is a graph showing an example of the light output control of the green LD 21b according to the sixth embodiment. As shown in FIG. 22, in the sixth embodiment, the rising time TB of the green LD 21b is equally divided into three division times ΔTb. A deficiency of the light amount in each of the division times ΔTb is compensated separately by correction light amounts ΔPb1–ΔPb3 in three stages. Otherwise, the sixth embodiment is the same as the fourth embodiment. The configuration different from those of the fourth and sixth embodiments is described hereinafter. In addition, components the same as those of the fourth and fifth embodiments are assigned with the same reference numerals, and descriptions thereof are omitted.

In FIG. 20, the division times ΔTb have equal time lengths. A time tb5 is a time when ΔTb has passed after the time tS, and a light of a light amount Pb3 is outputted from the LD 21b. A time tb6 is a time when 2ΔTb has passed after the time tS, and a light of a light amount Pb2 is outputted from the LD 21b. A time tb1 is a time when the rising time TB (=3ΔTb) has passed after the time tS, and a light of a constant light amount Pb1 corresponding to a fixed driving current Ib1 is outputted from the LD 21b. The light amounts are in a relationship of 0<Pb3<Pb2<Pb1.

A time tb3 is a time earlier than the time tE by 3ΔTb, a time tb7 is a time earlier than the time tE by 2ΔTb, and a time tb8 is a time earlier than the time tE by ΔTb. In the time tb3 to the time tb7, the light output controller 582 applies a driving current Ib2 to the LD 21b to enable the LD 21b to output a light of a light amount Pb4 (=Pb1+ΔPb1). Further, in the time tb7 to the time tb8, the light output controller 582 applies a driving current Ib3 to the LD 21b to enable the LD 21b to output a light of a light amount Pb5 (=Pb4+ΔPb2). Furthermore, in the time tb8 to the time tE, a driving current Ib4 is applied to the LD 21b to enable the LD 21b to output a light of a light amount Pb6 (=Pb5+ΔPb3). The light amounts are in a relationship of Pb1<Pb4<Pb5<Pb6.

Moreover, the correction light amounts ΔPb1-ΔPb3 are determined according to the change of the light output in the rising time TB of the LD 21b. In particular, these are preferably set to make the step change of each of the correction light amounts ΔPb1-ΔPb3 close to the change of the light output in the rising time TB. For example, the correction light amount ΔPb1 between the time tb3 and the time tb7 is set to a value in a range of 0<ΔPb1≤|Pb1-Pb2| according to the change of the light output between the time tb6 and the time tb1, and is set as |Pb1-Pb2|/2 in FIG. 22. Moreover, the correction light amount ΔPb2 between the time tb7 and the time tb8 is set to a value in a range of 0<ΔPb2≤|Pb2-Pb3| according to the change of the light output between the time tb5 and the time tb6, and is set as |Pb2-Pb3|/2 in FIG. 22. Furthermore, the correction light amount ΔPb3 between the time tb8 and the time tE is set to a value in a range of 0<ΔPb3≤Pb3 according to the change of the light output between the time tS and the time tb5, and is set as (Pb3)/2 in FIG. 22.

Described below is the appearance of the light amount of the scanning laser light 300 between the first scanning position H1 and the second scanning position H2 felt by the person who looks at the projection surface 102a in the case where the light output control is performed as shown in FIG. 22. Hereinafter, the appearance of the light amount of the green component of the scanning laser light 300 is described in the same manner as FIG. 22. Needless to say, the appearances of the light amounts of the other color components (i.e., the red component and blue component) may be felt in the same way.

Figures 23A, 23B:
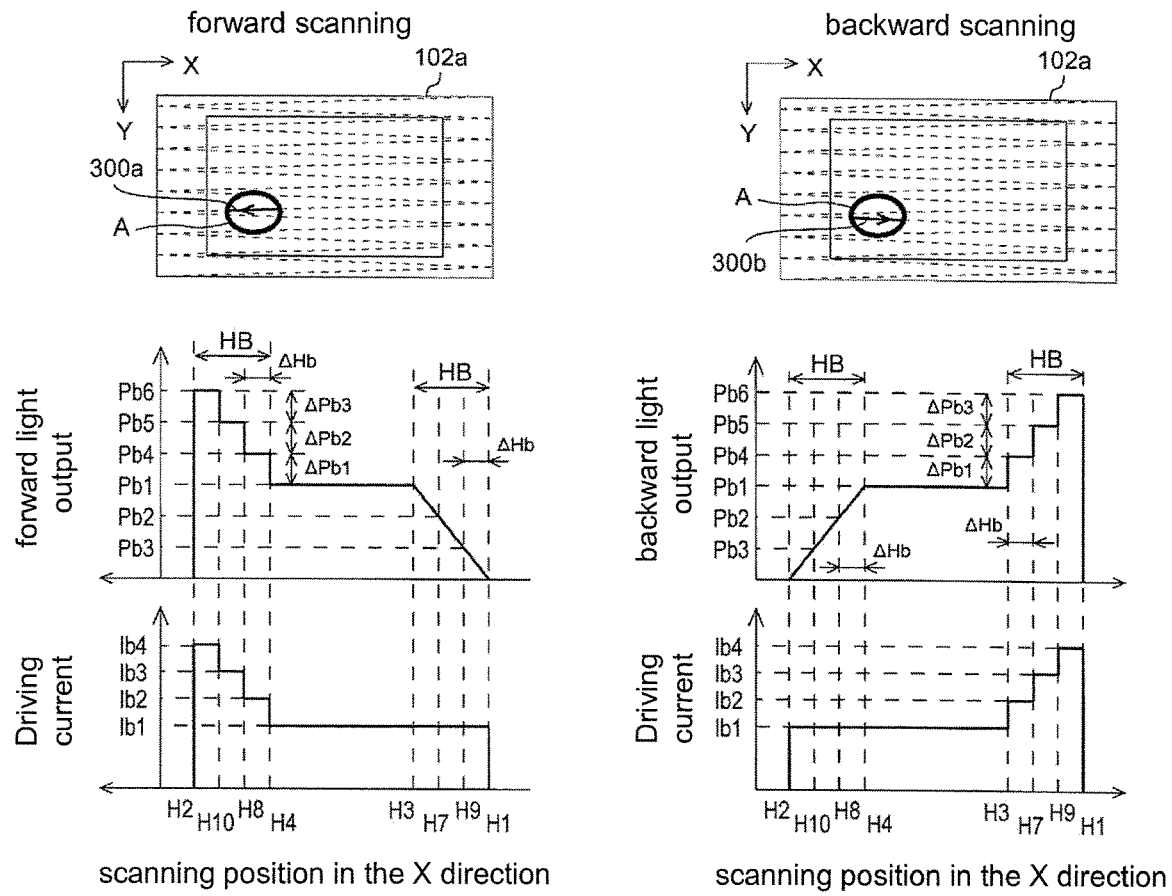
FIG. 23A is a diagram showing a change of the light output of the forward scanning light that scans from the first scanning position to the second scanning position according to the sixth embodiment.
FIG. 23B is a diagram showing a change of the light output of the backward scanning light that scans from the second scanning position to the first scanning position according to the sixth embodiment.
Figure 23C:
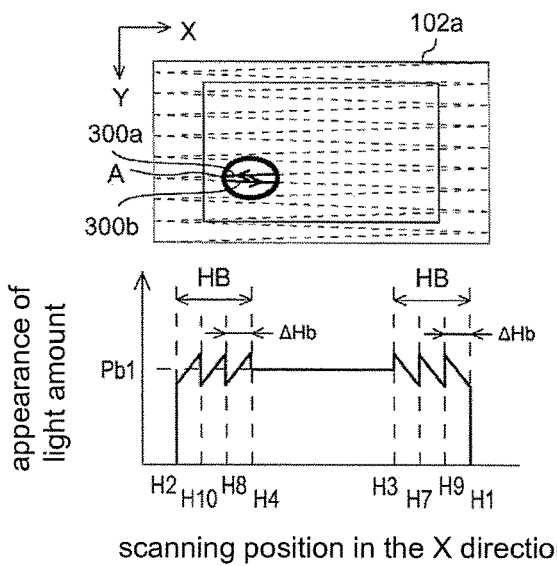
FIG. 23C is a diagram showing a change of the appearance of the light amount of the scanning light between the first scanning position and the second scanning position according to the sixth embodiment.

FIG. 23A to FIG. 23C are diagrams for illustrating the appearance of the light amount of the scanning laser light 300 between the first scanning position H1 and the second scanning position H2 according to the sixth embodiment. FIG. 23A is a diagram showing a change of the light output of the forward scanning laser light 300a that scans from the first scanning position H1 to the second scanning position H2 according to the sixth embodiment. FIG. 23B is a diagram showing a change of the light output of the backward scanning laser light 300b that scans from the second scanning position H2 to the first scanning position H1 according to the sixth embodiment. FIG. 23C is a diagram showing a change of the appearance of the light amount of the scanning laser light 300 between the first scanning position H1 and the second scanning position H2 according to the sixth embodiment.

It should be noted that the horizontal axis of the graphs in FIG. 23A to FIG. 23C indicates the position of the scanning laser light 300 in the X direction, which is different from FIG. 22. Therefore, the graph shapes of the light output and driving current and the direction of the horizontal axis of FIG. 23A related to the forward scanning laser light 300a are reverse to those of FIG. 23B related to the backward scanning laser light 300b. Moreover, FIG. 23C represents the appearance of the light amount in the overlapping scanning range 301c (refer to FIG. 13) between the first scanning position H1 and the second scanning position H2, felt by the person when the aforementioned effect of averaging the light amounts is applied.

The first scanning position H1 is the scanning position of the forward scanning laser light 300a of the LD 21b at the light emission start time and is also the scanning position of the backward scanning laser light 300b of the LD 21b at the light emission end time. Moreover, the second scanning position H2 is the scanning position of the forward scanning laser light 300a of the LD 21b at the light emission end time and is also the scanning position of the backward scanning laser light 300b of the LD 21b at the light emission start time. The scanning position H3 is the scanning position of the forward scanning laser light 300a when the rising time TB has passed after the start of light emission at the first scanning position H1 and is also the scanning position of the backward scanning laser light 300b at a time that is earlier than the end of light emission at the first scanning position H1 by 3ΔTb (=TB). In addition, the scanning position H4 is the scanning position of the forward scanning laser light 300a at a time that is earlier than the end of light emission at the second scanning position H2 by 3ΔTb (=TB) and is also the scanning position of the backward scanning laser light 300b when the rising time TB has passed after the start of light emission at the first scanning position H1.

Regarding the forward scanning laser light 300a of the LD 21b, the scanning position H8 indicates the scanning position at a time that is earlier than the end of light emission at the second scanning position H2 by 2ΔTb. The scanning position H10 indicates the scanning position at a time that is earlier than the end of light emission at the second scanning position H2 by the division time ΔTb. Regarding the forward scanning laser light 300a, a range between the scanning positions H1 and H3 corresponds to a rising scanning range HB, and a range between the scanning positions H2 and H4 corresponds to a light supplement scanning range ΔHb.

Further, regarding the backward scanning laser light 300b of the LD 21b, the scanning position H7 indicates the scanning position at a time that is earlier than the end of light emission at the first scanning position H1 by 2ΔTb. The scanning position H10 indicates the scanning position at a time that is earlier than the end of light emission at the second scanning position H2 by the division time ΔTb. Regarding the backward scanning laser light 300b, a range between the scanning positions H2 and H4 corresponds to the rising scanning range HB, and a range between the scanning positions H1 and H3 corresponds to the light supplement scanning range ΔHb.

A distance between the scanning positions H1 and H3 of the forward scanning laser light 300a and a distance between the scanning positions H2 and H4 of the backward scanning laser light 300b are both HB. Further, a distance between the scanning positions H2 and H10, a distance between the scanning positions H8 and H10, and a distance between the scanning positions H4 and H8 of the forward scanning laser light 300a and a distance between the scanning positions H3 and H7, a distance between the scanning positions H7 and H9, and a distance between the scanning positions H1 and H9 of the backward scanning laser light 300b in the X direction are all ΔHb.

When the forward and backward scanning laser lights 300a and 300b scan, the light amount between the scanning positions H1 and H2 visually felt by the person is as depicted by the graph of FIG. 23C. That is, between the scanning positions H1 and H3, the deficiency of the light amount in the rising scanning range HB of the forward scanning laser light 300a is uniformly supplemented by the correction light amounts ΔPb1–ΔPb3 in the light supplement scanning range ΔHb of the backward scanning laser light 300b. Moreover, between the scanning positions H2 and H4, the deficiency of the light amount in the rising scanning range HB of the backward scanning laser light 300b is uniformly supplemented by the correction light amounts ΔPb1-ΔPb3 in the light supplement scanning range ΔHb of the forward scanning laser light 300a. Accordingly, the light amounts visually felt by the person between the scanning positions H1 and H3 and between the scanning positions H2 and H4 can be close to the constant light amount Pb1 that corresponds to the fixed driving current Ib1. Therefore, the reduction in light amount resulting from the light emission delay at the start of light emission of the LD 21b is improved.

Additionally, the light outputs of the red LD 21a and the blue LD 21c may be controlled in the same manner as described above. Accordingly, by performing the light output control described above, the color unevenness, which results from the light emission delay of each of the LD 21a-21c in the edge portion of the overlapping scanning range 301c where the forward and backward scanning laser lights 300a and 300b overlap in the X direction, i.e., the scanning range between the scanning positions H1 and H3 and the scanning range between the scanning positions H2 and H4, is reduced or prevented.

The correction light amounts are divided into three stages (ΔPb1-ΔPb3) in FIG. 22 and FIG. 23A to FIG. 23C. However, the invention is not limited to this example, and the correction light amounts may also be divided into two or four stages or more. As the number of divisions increases, the number of the processes increases, but the color unevenness is improved more uniformly and accurately.

Seventh Embodiment

The seventh embodiment is described hereinafter. In the seventh embodiment, before the driving currents of the current values Ia1, Ib1, and Ic1 corresponding to the constant light amounts Pa1-Pc1 are applied to the LD 21a-21c, a preliminary current of an infinitesimal current value Ip that is less than the oscillation threshold current Is of each of the LD 21a-21c is applied. Otherwise, the fourth embodiment is the same as the first embodiment. The configuration different from those of the fourth to sixth embodiments is described hereinafter. In addition, components the same as those of the first to sixth embodiments are assigned with the same reference numerals, and descriptions thereof are omitted. In the seventh embodiment, the light output control of the red LD 21a is described below as an example. Nevertheless, the light outputs of the other LD 21b and 21c can be controlled in the same manner.

Figure 24:
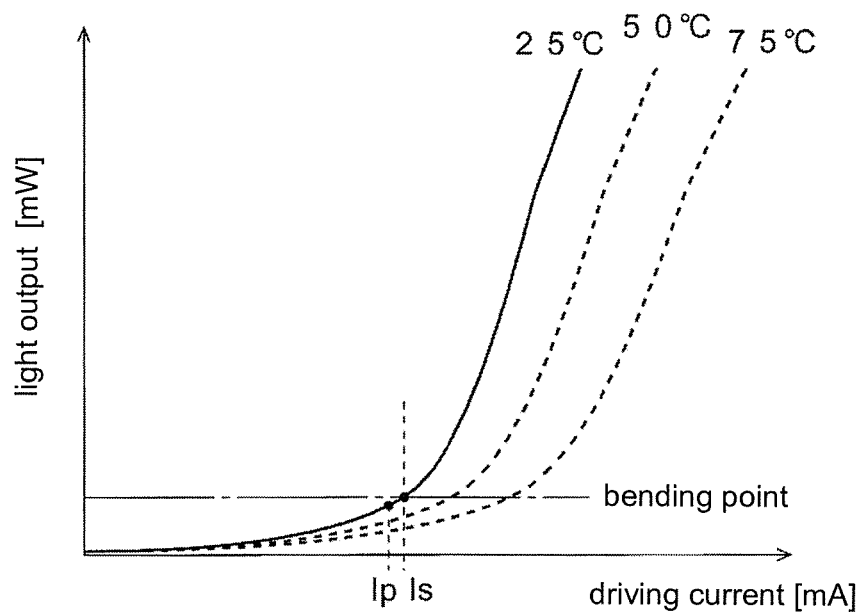
FIG. 24 is a graph showing light output characteristics of the red LD with respect to the driving current.

First, current-light output characteristics of the red semiconductor laser element 21a are described. FIG. 24 is a graph showing light output characteristics of the red LD 21a with respect to the driving current. As shown in FIG. 24, when an element temperature is 25 degrees, the red LD 21a represents the current-light output characteristics depicted by the solid-line graph. The current value Is corresponding to a bending point of the solid-line graph represents the oscillation threshold current Is of the red LD 21a. The oscillation threshold current Is is the current value that indicates the lower limit of the current value, by which the red LD 21a emits light only in the laser oscillation mode, and corresponds to the current value IB of FIG. 3. That is, when applied with a current value that is equal to or more than the oscillation threshold current Is, the red LD 21a outputs a coherent light with relatively uniform wavelength and phase by a stable laser oscillation operation. On the other hand, when the red LD 21a is applied with a current value that is less than the oscillation threshold current Is, the light emission mode changes and the wavelength and the phase of the emitted light also become irregular. However, if the current value Ip less than the oscillation threshold current Is is applied to the LD 21a before the driving current equal to or more than the oscillation threshold current Is is applied, the light emission delay is suppressed and the rising time TA becomes much faster. In this embodiment, this phenomenon is utilized to improve the reduction in light amount that results from the light emission delay at the start of light emission of the LD 21a-21c. That is, the preliminary current of the current value Ip that is less than the oscillation threshold current Is is applied to the LD 21a-21c in a predetermined period (an application time Tp to be described later) right after the start of light emission of the scanning laser lights 300a and 300b in the scanning range as shown in FIG. 5.

The current value Ip is not required to deviate largely from the oscillation threshold current Is and may be a slightly smaller current value. Besides, as shown in FIG. 24, the current-light output characteristics of the LD 21a change because of the element temperature and deterioration of the element. Thus, the current value Ip of the preliminary current is determined according to the current-light output characteristics (particularly, the oscillation threshold current Is) corresponding to these conditions.

Figure 25:
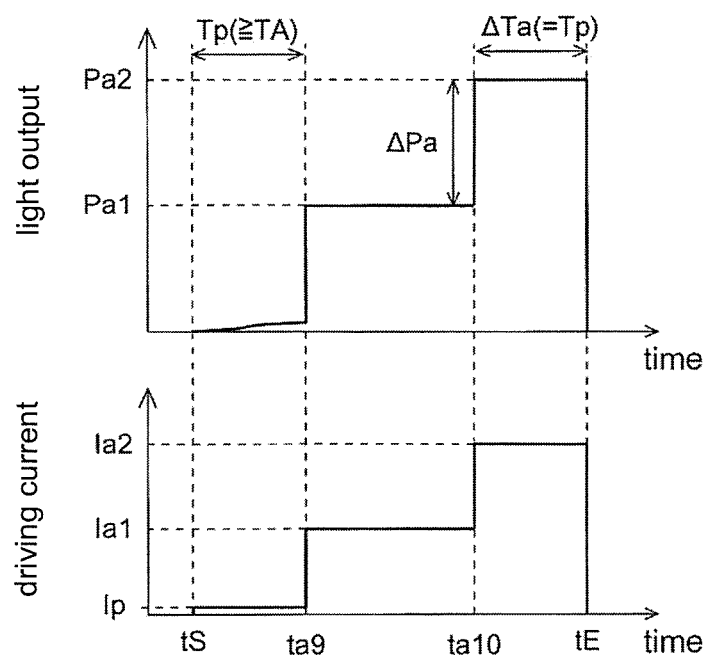
FIG. 25 is a graph showing an example of the light output control of the red LD according to the seventh embodiment.

FIG. 25 is a graph showing an example of the light output control of the red LD 21a according to the seventh embodiment. FIG. 25 illustrates the light output control of the red LD 21a from the start to the end of light emission of the forward and backward scanning laser lights 300a and 300b. In FIG. 25, a time ta9 is a time when the application time Tp has passed after the time tS, and is a time when a light of the light amount Pa1 is outputted from the LD 21a. Moreover, a time ta10 is a time that is earlier than the time tE by the light supplement time ΔTa (=Tp), and is a time when a light of the light amount Pa2, which is greater than the light amount Pa1 by the correction light amount ΔPa, is outputted from the LD 21a.

The preliminary current of the current value Ip is applied to the LD 21a in the predetermined period Tp between the times tS-ta9 right after the start of light emission. In addition, the driving current of the current value Ia1 is applied during the times ta9-ta10, and the driving current of the current value Ia2 is applied during the times ta3-tE. The application time Tp for applying the preliminary current of the current value Ip to the LD 21a is equal to or more than the rising time TA of the LD 21a. When Tp≥TA, the light emission delay is significantly suppressed or prevented even if the driving current of the current value Ia1 (>>Ip) is applied to the LD 21a at the time ta2. On the other hand, if Tp<TA, the light emission delay occurs at the time ta2.

Described below is the appearance of the light amount of the scanning laser light 300 between the first scanning position H1 and the second scanning position H2 felt by the person who looks at the projection surface 102a in the case where the light output control is performed as shown in FIG. 25. Hereinafter, the appearance of the light amount of the red component of the scanning laser light 300 is described in the same manner as FIG. 25. Needless to say, the appearances of the light amounts of the other color components (i.e., the green component and blue component) may be felt in the same way.

FIG. 26A to FIG. 26C are diagrams for illustrating the appearance of the light amount of the scanning laser light 300 between the first scanning position H1 and the second scanning position H2 according to the seventh embodiment. FIG. 26A is a diagram showing a change of the light output of the forward scanning laser light 300a that scans from the first scanning position H1 to the second scanning position H2 according to the seventh embodiment. FIG. 26B is a diagram showing a change of the light output of the backward scanning laser light 300b that scans from the second scanning position H2 to the first scanning position H1 according to the seventh embodiment. FIG. 26C is a diagram showing a change of the appearance of the light amount of the scanning laser light 300 between the first scanning position H1 and the second scanning position H2 according to the seventh embodiment.

It should be noted that the horizontal axis of the graphs in FIG. 26A to FIG. 26C indicates the position of the scanning laser light 300 in the X direction, which is different from FIG. 25. Therefore, the graph shapes of the light output and driving current and the direction of the horizontal axis of FIG. 26A related to the forward scanning laser light 300a are reverse to those of FIG. 25B related to the backward scanning laser light 300b. Moreover, FIG. 25C represents the appearance of the light amount in the overlapping scanning range 301c (refer to FIG. 13) between the first scanning position H1 and the second scanning position H2, felt by the person when the aforementioned effect of averaging the light amounts is applied.

A scanning position H11 is the scanning position of the forward scanning laser light 300a when the application time Tp has passed after the start of light emission at the first scanning position H1 and is also the scanning position of the backward scanning laser light 300b at a time that is earlier than the end of light emission at the first scanning position H1 by the light supplement time ΔTa (=Tp). In addition, a scanning position H12 is the scanning position of the forward scanning laser light 300a at a time that is earlier than the end of light emission at the second scanning position H2 by the light supplement time ΔTa and is also the scanning position of the backward scanning laser light 300b when the application time Tp has passed after the start of light emission at the second scanning position H2. Regarding the forward scanning laser light 300a, a range between the scanning positions H1 and H11 corresponds to a scanning range of the application time Tp (referred to as "application scanning range" hereinafter), and a range between the scanning positions H2 and H12 corresponds to a scanning range of the light supplement time ΔTa before the light emission ends (i.e., light supplement scanning range ΔHp). Regarding the backward scanning laser light 300b, a range between the scanning positions H2 and H12 corresponds to the application scanning range of the application time Tp, and a range between the scanning positions H1 and H11 corresponds to the light supplement scanning range ΔHp of the light supplement time ΔTa before the light emission ends.

Regarding the forward and backward scanning laser lights 300a and 300b, the light amount Pa2 during the light supplement scanning range ΔHp is greater than the light amount Pa1 that corresponds to the driving current Ia1 by the correction light amount ΔPa. Moreover, as described above, ΔTa=Tp. Therefore, a distance between the scanning positions H1 and H11 of the forward scanning laser light 300a and a distance between the scanning positions H2 and H12 of the backward scanning laser light 300b are both Hp. Further, a distance between the scanning positions H2 and H12 of the forward scanning laser light 300a and a distance between the scanning positions H1 and H11 of the backward scanning laser light 300b are both Hp as well.

When the forward and backward scanning laser lights 300a and 300b scan, the light amount between the scanning positions H1 and H2 visually felt by the person is as depicted by the graph of FIG. 26C. That is, the deficiency of the light amount in the application scanning range of the forward scanning laser light 300a is supplemented by the correction light amount ΔPa of the light supplement scanning range ΔHp of the backward scanning laser light 300b. Besides, the deficiency of the light amount in the application scanning range of the backward scanning laser light 300b is supplemented by the correction light amount ΔPa of the light supplement scanning range ΔHp of the forward scanning laser light 300a. Accordingly, the light amounts visually felt by the person between the scanning positions H1 and H11 and between the scanning positions H2 and H12 can be close to the constant light amount Pa1 that corresponds to the fixed driving current Ia, and the appearance of the light amount between the scanning positions H1 and H3 can be set to Pa1.

The configuration for applying the preliminary current of the current value Ip by the application time Tp in this embodiment is applied to all the LD 21a-21c. Nevertheless, the invention is not limited to this example. This configuration may also be applied to at least one of the multiple LD 21a-21c (particularly, the red LD 21a that has the longest rising time).

Figure 27:
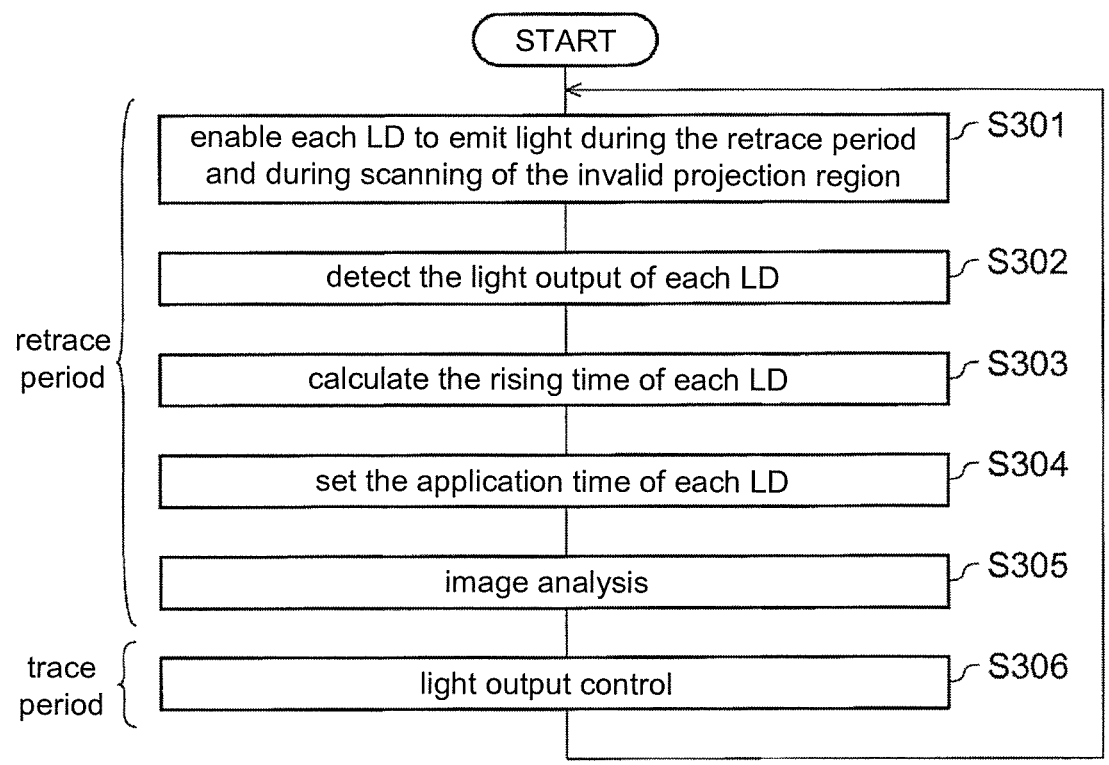
FIG. 27 is a flowchart for explaining another example of the light output control process of the LD.

Next, a light output control process for the LD 21a-21c is described. FIG. 27 is a flowchart for explaining an example of the light output control process of the LD 21a-21c according to the seventh embodiment. S301-S305 described below are performed in the retrace period and S306 is performed in the trace period.

First, in the retrace period, when the optical axis of the scanning laser light 300 scans the invalid projection region 102c, the light output controller 582 enables the LD 21a-21c to emit light at the predetermined light amounts (e.g., Pa1, Pb1, and Pc1) by applying the predetermined driving currents Ia1-Ic1 to the LD 21a-21c (S301). The times of application of the driving currents Ia1-Ic1 are longer than the rising times TA, TB, and TC of the LD 21a-21c respectively. Light outputs of the LD 21a-21c are detected by the PD 23a-23c respectively (S302). The calculating part 583 calculates the rising times TA, TB, and TC of the LD 21a-21c, based on the detection results of the PD 23a-23c (S203). Furthermore, the calculating part 583 sets the application time Tp for the preliminary current of the current value Ip to each of the LD 21a-21c, based on the result of S303 (S304). In addition, the light output controller 582 imports the image data outputted from the image processor 581 into a memory (not shown) and performs an image analysis on the projection image projected to the combiner 102 in the trace period based on the image data (S305). That is, the color information, brightness information, and so on of the projection image formed in the trace period are analyzed.

Thereafter, in the trace period, the light output controller 582 performs light output control over the multiple LD 21a-21c based on the result of the image analysis, the calculation result of the calculating part 583, the light output correction information read from the storage part 57, and so on (S306).

Conclusion of the Fourth to the Seventh Embodiments

According to the fourth to the seventh embodiments described above, the projector unit 101 includes the LD 21a-21c that output the scanning laser light 300 of the light amounts Pa1, Pb1, and Pc1 (first light amount), the MEMS engine 3 that has the direction range on the projection surface 102a and reciprocally scans with the scanning laser light 300 in the predetermined direction (e.g., the X direction), and the light output controller 582 that controls the light outputs of the LD 21a-21c. The light output controller 582 sets a second light amount (Pa2, Pb4-6, and so on), in the light supplement scanning range ΔHa (second scanning range) right before the light emission end position within the scanning ranges 301a and 301b (first scanning range) scanned by the scanning laser light 300 from the start to the end of the light emission, to be greater than the light amounts Pa1, Pb1, and Pc1 when rapidly reducing the light amount of the scanning laser light 300 at the end of the light emission. (Referring to the thirtieth configuration)

According to the thirtieth configuration, regarding the scanning laser light 300 that scans reciprocally on the projection surface 102a, when the light amount of the scanning laser light 300 is reduced rapidly at the end of the light emission, the light amounts Pa2, Pb4-6, and so on (the second light amount), in the light supplement scanning range ΔHa (the second scanning range) right before the light emission end position within the scanning ranges 301a and 301b (the first scanning range) scanned by the scanning laser light 300 from the start to the end of the light emission, are set greater than the light amounts Pa1, Pb1, and Pc1 (the first light amount). Here, because the scanning laser light 300 scans reciprocally, if the light amount of the scanning laser light 300 is reduced rapidly at the end of the light emission, usually the light amount at the start of the light emission of the next scanning laser light 300 is increased rapidly and a reduction in the light amount that results from the light emission delay (so-called "rising delay") occurs. On the other hand, according to the aforementioned configuration, the light amount that drops lower than the light amounts Pa1, Pb1, and Pc1, which results from the light emission delay at the start of the light emission of one of the forward and backward scanning laser lights 300a and 300b, can be supplemented by the light amounts Pa2, Pb4-6, and so on (the second light amount) in the light supplement scanning range ΔHa right before the light emission end position of the other one of the scanning laser lights 300b and 300a. Accordingly, the reduction in light amount of the scanning laser light 300 visually felt by the person is alleviated. Thus, the reduction in light amount resulting from the light emission delay at the start of light emission of the LD 21a-21c is improved.

Moreover, in the projector unit 101 of the thirtieth configuration, a memory (not shown) that stores the image information (image data) formed on the projection surface 102a is further included, and the light output controller 582 may analyze the image information and control the light output based on a result of the analysis. (Referring to the thirty-first configuration)

According to the thirty-first configuration, the light outputs of the LD 21a-21c can be controlled based on the result of analysis of the image information formed on the projection surface 102a. (Referring to thirty-second configuration)

Further, in the projector unit 101 of the thirty-first or the thirty-second configuration, the light output controller 582 may set the light amounts Pa2, Pb4-6, and so on (the second light amount) to be greater than the light amounts Pa1, Pb1, and Pc1 when the falling time that is from the start of reduction of the light amount of the scanning laser light 300 to the end of the light emission is shorter than the rising time TA for reaching the light output of the light amounts Pa1, Pb1, and Pa (the first light amount) after the start of the light emission. (Referring to the thirty-third configuration)

According to the thirty-third configuration, if the falling time at the end of the light emission is shorter than the rising time TA at the start of the light emission, the light amount of the scanning laser light 300a or 300b decreases rapidly at the end of the light emission. Therefore, although a reduction of the light amount resulting from the light emission delay usually occurs at the start of the light emission of the next scanning laser light 300b or 300a, the reduction of the light amount can be supplemented by the light amounts Pa2, Pb4-6, and so on (the second light amount).

In addition, in the projector unit 101 of any one of the tenth to the thirteenth configurations, the light output controller 582 may set the light emission start position and the light emission end position of the scanning range 301a of the forward scanning laser light 300a to respectively correspond to the light emission end position and the light emission start position of the scanning range 301b of the backward scanning laser light 300b. (Referring to the thirty-fourth configuration)

According to the thirty-fourth configuration, the light amount that drops lower than the light amounts Pa1, Pb1, and Pc1 (the first light amount), which results from the light emission delay at the start of the light emission of one of the forward and backward scanning laser lights 300a and 300b, can be certainly supplemented by the second light amount (Pa2, Pb4-6, and so on) of the other one of the scanning laser lights 300b and 300a.

Furthermore, in the projector unit 101 of the thirty-fourth configuration, in the predetermined direction (e.g., the X direction) having direction range, the light supplement scanning range ΔHa of the forward scanning laser light 300a may overlap the rise scanning ranges HA and HB (third scanning range) scanned by the backward scanning laser light 300b from the start of the light emission of the backward scanning laser light 300b to where the light output of the light amounts Pa1, Pb1, and Pc1 (the first light amount) is reached. Moreover, the light supplement scanning range ΔHa of the backward scanning laser light 300b may overlap the rise scanning ranges HA and HB scanned by the forward scanning laser light 300a from the start of the light emission of the forward scanning laser light 300a to where the light output of the light amounts Pa1, Pb1, and Pc1 is reached. (Referring to the thirty-fifth configuration)

According to the thirty-fifth configuration, the light supplement scanning range ΔHa can overlap the rising scanning ranges HA and HB. In the light supplement scanning range ΔHa, the light amount of the scanning laser light 300 is greater than the light amounts Pa1, Pb1, and Pa (the first light amount). In the rising scanning ranges HA and HB, the light amount of the scanning laser light 300 is lower than the light amounts Pa1, Pb1, and Pc1 due to the light emission delay. Accordingly, the scanning laser light 300 of the light amount that is greater than the light amounts Pa1, Pb1, and Pc1 can be projected certainly in the rising scanning ranges HA and HB.

Additionally, in the projector unit 101 of the fourteenth or the thirty-fifth configuration, in the predetermined direction (e.g., the X direction) having direction range, the scanning distance of the forward scanning laser light 300a in the light supplement scanning range ΔHa may be equal to or less than the scanning distance of the backward scanning laser light 300b in the rising scanning ranges HA and HB. Further, the scanning distance of the backward scanning laser light 300b in the light supplement scanning range ΔHa may be equal to or less than the scanning distance of the forward scanning laser light 300a in the rising scanning ranges HA and HB. (Referring to the thirty-sixth configuration)

According to the thirty-sixth configuration, it is possible not to project the scanning laser light 300 of the light amounts Pa2, Pb4-6, and so on (the second light amount) that are greater than the light amounts Pa1, Pb1, and Pd. (the first light amount) in the scanning range outside the rising scanning ranges HA and HB where the light amount decreases due to the light emission delay within the scanning ranges 301a and 301b.

Furthermore, in the projector unit 101 of any one of the thirty-fourth to the thirty-sixth configurations, the light output controller 582 may set the cumulative light amounts S2 and s2 of the forward and backward scanning laser lights 300a and 300b in the light supplement scanning range ΔHa to be equal to the cumulative amounts S1 and s1 of the reduction of the light amount resulting from the light emission delay of the LD 21a-21c. (Referring to the thirty-seventh configuration)

According to the thirty-seventh configuration, the cumulative amounts S1 and s1 of the reduction of the light amount resulting from the light emission delay are supplemented by the cumulative light amounts S2 and s2 in the light supplement scanning range ΔHa, by which the reduction of the light amount of the scanning laser lights 300a and 300b resulting from the light emission delay, visually felt by the person, can be improved or eliminated effectively.

Moreover, in the projector unit 101 of any one of the thirtieth to the thirty-seventh configurations, the LD driver 52 that supplies the driving current to the LD 21a-21c is further included. The LD 21a-21c are semiconductor laser elements, and the LD driver 52 may reduce the driving current from the first current value, which is equal to or more than the oscillation threshold current Is indicating the lower limit of the current value by which the LD 21a-21c emit light only in the laser oscillation mode, to the second current value, which is less than the oscillation threshold current Is, when rapidly reducing the light amount of the scanning laser light 300 at the end of the light emission. (Referring to the thirty-eighth configuration)

According to the thirty-eighth configuration, the light amount of the scanning laser light 300 emitted from the LD 21a-21c that emit light only in the laser oscillation mode can be reduced rapidly.

Moreover, in the projector unit 101 of any one of the thirtieth to the thirty-eighth configurations, the light output controller 582 may increase the light amounts Pb4-6 (refer to FIG. 22, for example) in the light supplement scanning range ΔHa by dividing the light amounts Pb4-6 into a plurality of stages. (Referring to the thirty-ninth configuration)

According to the thirty-ninth configuration, the scanning laser light 300 can be projected according to the distribution of the light amount that decreases due to the light emission delay. Accordingly, the reduction of the light amount resulting from the light emission delay at the start of light emission of the LD 21a-21c can be improved uniformly.

Besides, in the projector unit 101 of any one of the thirtieth to the thirty-ninth configurations, the LD 21a-21c are semiconductor laser elements, and in the predetermined period Tp right after the start of the light emission of the scanning laser lights 300a and 300b in the first scanning ranges 301a and 301b, the preliminary current of the current value Ip less than the oscillation threshold current Is indicating the lower limit of the current value by which the LD 21a-21c emit light only in the laser oscillation mode may be applied to the LD 21a-21c. (Referring to the fortieth configuration)

According to the fortieth configuration, the light emission delay of the LD 21a-21c can be suppressed or prevented by applying the preliminary current of the current value Ip less than the oscillation threshold current Is to the LD 21a-21c in advance.

Further, in the projector unit 101 of the twentieth configuration, the application time Tp of the preliminary current (the current value Ip) may be equal to or more than the rising times TA, TB, and TC that are required for the LD 21a-21c to reach the light output of the light amounts Pa1, Pb1, and Pc1 (the first light amount) after starting the light emission. (Referring to the forty-first configuration)

According to the forty-first configuration, since the application time Tp of the preliminary current of the current value Ip is set equal to or more than the rising times TA, TB, and TC, the light emission delay of the LD 21a-21c can be prevented.

Moreover, according to the fourth to seventh embodiments, the projector unit 101 includes the LD 21a-21c that emit the laser light 300, the MEMS engine 3 that scans the laser light 300, and the light output controller 582 that controls the light amounts of the LD 21a-21c. The light output controller 582 starts and ends the forward and backward light emissions of the LD 21a-21c. The scanning range from the start to the end of at least one of the forward and backward light emissions of the LD 21a-21c includes the rising scanning range HA from when the light emission starts to when the light amounts reach the first light amounts Pa1, Pb1, and Pc1 (first scanning range), the forward range between H3 and H6 and the backward range between H4 and H5 which are scanned with the light amounts being the first light amounts Pa1, Pb1, and Pc1 (second scanning range), and the light supplement scanning range ΔHa from the time when the light amounts reach the second light amounts (Pa2, Pb4-6, and so on), which are more than the first light amounts Pa1, Pb1, and Pc1, to the time when the light emission ends (third scanning range). The length of the light supplement scanning range ΔHa is equal to or less than the length of the rise scanning range HA. (Referring to the forty-second configuration)

In addition, the projector unit 101 of the twenty-second configuration further includes the storage part 57 that stores the image information of the projection image, and the light output controller 582 is configured to analyze the image information and control the light amount based on the result of the analysis. (Referring to the forty-third configuration)

Besides, regarding the projector unit 101 of the forty-second or the forty-third configuration, the light emission start position and the light emission end position of the forward rising scanning range HA are set to respectively correspond to the light emission end position and the light emission start position of the backward light supplement scanning range ΔHa. (Referring to the forty-fourth configuration)

Additionally, regarding the projector unit 101 of the forty-fourth configuration, the rising scanning range HA of the forward laser light 300a is set to overlap the light supplement scanning range ΔHa of the backward laser light 300b. (Referring to the forty-fifth configuration)

Furthermore, regarding the projector unit 101 of the forty-fourth or the twenty-fifth configuration, the length of the light supplement scanning range ΔHa of the forward laser light 300a is set equal to or less than the length of the rising scanning range HA of the backward laser light 300b. (Referring to the forty-sixth configuration)

Moreover, regarding the projector unit 101 of any one of the forty-fourth to the forty-sixth configurations, the light output controller 582 is configured to make the cumulative light amount of at least one laser light 300 in the light supplement scanning range ΔHa the same as the cumulative amount of the light amount reduced due to the light emission delay of the light emitting element that outputs the at least one laser light 300. (Referring to the forty-seventh configuration)

Additionally, the projector unit 101 of the forty-seventh configuration further includes the LD driver 52 that supplies the driving current to the light emitting element that outputs the laser light 300, wherein the light emitting element is a semiconductor laser element, and the LD driver 52 is configured to reduce the driving current from the first current value, which is equal to or more than the oscillation threshold current Is indicating the lower limit of the current value by which the semiconductor laser element emits light only in the laser oscillation mode, to the second current value, which is less than the oscillation threshold current Is, in the light supplement scanning range ΔHa of the at least one laser light 300. (Referring to the forty-eighth configuration)

Moreover, regarding the projector unit 101 of any one of the forty-seventh to the forty-eighth configuration, the light emitting element is a semiconductor laser element, and in the application period Tp after the light emission of the laser light 300 in the rising scanning range HA is started, the preliminary current having the current value Ip that is less than the oscillation threshold current Is indicating the lower limit of the current value by which the semiconductor laser element emits light only in the laser oscillation mode is applied to the semiconductor laser element. (Referring to the forty-ninth configuration)

Besides, regarding the projector unit 101 of the forty-ninth configuration, the application time Tp of the preliminary current (the current value Ip) is set equal to or more than the rising times TA, TB, and TC that are required for the light amount to reach the first light amounts Pa1, Pb1, and Pc1 after the light emission of the semiconductor laser element starts. (Referring to the fiftieth configuration)

Further, regarding the projector unit 101 of the forty-second to the fiftieth configurations, the light output controller 582 is configured to increase the second light amount (Pa2, Pb4-6, and so on) in the light supplement scanning range ΔHa in a plurality of stages. (Referring to the fifty-first configuration)

Embodiments of the invention have been described above. However, those skilled in the art should understand that the above embodiments are exemplary and it is possible to make various modifications to the combination of the components/elements or processes within the scope of the invention.

For example, in the first to seventh embodiments described above, a part or all of the components 581-583 of the CPU 58 may be functional components or physical components such as electrical circuits, apparatuses, and devices. Moreover, at least some of the components 581-583 may be independent of the CPU 58.

Further, although the first to seventh embodiments describe the laser projector 101 of the HUD device 10 as an example, application of the invention is not limited to these examples. The invention is extensively applicable to any device for light output control of multiple light sources that have different light emitting wavelengths.

What is claimed is:
1. A projection device, comprising:
 plurality of light sources respectively emitting a laser light;
 a scanning part enabling the laser light to scan; and
 a controller controlling an output of the laser light,
 wherein in a scanning range including a first scanning range and a second scanning range, the controller controls such that the output has a first light amount in the first scanning range and has a second light amount during the second scanning range, the second light amount during the second scanning range is greater than the first light amount in the first scanning range, and wherein, in each of the light sources, an amplitude of a driving current in the second scanning range is greater than an amplitude of a driving current in the first scanning range, and
 in the scanning range, the controller controls such that the output has the first light amount in the first scanning range and has the second light amount which is greater than the first light amount in the second scanning range, based on that a time from when emission of the laser light starts to when the output reaches the first light amount is longer than a time from when the output starts to decrease from the first light amount to when the emission of the laser light ends.

2. The projection device of claim 1, including a memory that stores an image information of an image projected to a projection surface, and
 the controller controlling the output of the laser light based on the image information.

3. The projection device of claim 1, the scanning part enables the laser light to scan reciprocally, and an emission start position and an emission end position of the laser light in the first scanning range of a forward scan is set to respectively correspond to an emission end position and an emission start position of the laser light in the first scanning range of a backward scan.

4. The projection device of claim 3, the second scanning range of the forward scan overlaps a third scanning range where the laser light of the backward scan is scanned from when an emission of the backward scan starts to when the output reaches the first light amount.

5. The projection device of claim 4, a scanning distance in the second scanning range of the forward scan is equal to or less than a scanning distance in the third scanning range of the backward scan.

6. The projection device of claim 3, the controller controls such that cumulative light amounts respectively in the second scanning ranges of the forward scan and the backward scan are the same as a cumulative amount of a light amount that is reduced due to an emission delay of the light source.

7. The projection device of claim 1, including a light source driving part that supplies the driving current to the light source, the light source is a semiconductor laser element, and in a case that a light amount of the laser light is rapidly reduced when emission ends, the light source driving part reduces the driving current from a first current value, which is equal to or more than an oscillation threshold current, to a second current value, which is less than the oscillation threshold current, and the oscillation threshold current is a lower limit of a current value by which the semiconductor laser element emits light in a laser oscillation mode.

8. The projection device of claim 1, the controller increases the second light amount in the second scanning range in a plurality of stages.

9. The projection device of claim 1, the light source is a semiconductor laser element, and the semiconductor laser element is applied with a current that is less than a current value, by which the semiconductor laser element emits light only in a laser oscillation mode, in a predetermined period till the emission in the first scanning range starts.

10. The projection device of claim 9, a supply time of the current is equal to or more than a time that is required for the semiconductor laser element to reach the light output of the first light amount after starting emission.

\* \* \* \* \*